US012740223B2

(12) United States Patent
Sakakibara et al.

(10) Patent No.: US 12,740,223 B2

(45) Date of Patent: Sep. 15, 2026

(54) ELECTROLUMINESCENT ELEMENT, LIGHT-EMITTING DEVICE, AND METHOD FOR PRODUCING ELECTROLUMINESCENT ELEMENT

(71) Applicants: Sharp Kabushiki Kaisha, Sakai City (JP); TOPPAN INC., Tokyo (JP)

(72) Inventors: Yusuke Sakakibara, Sakai City (JP); Kazuki Goto, Sakai City (JP); Masaki Yamamoto, Sakai City (JP); Tatsuya Ryohwa, Sakai City (JP); Mikihiro Takasaki, Chikushino-city (JP); Yuka Takamizuma, Chikushino-city (JP); Hironori Matsuzawa, Chikushino-city (JP)

(73) Assignees: SHARP KABUSHIKI KAISHA, Sakai City (JP); TOPPAN INC., Tokyo (JP)

( * ) Notice: Subject to any disclaimer, the term of this patent is extended or adjusted under 35 U.S.C. 154(b) by 284 days.

(21) Appl. No.: 18/284,181

(22) PCT Filed: Mar. 31, 2021

(86) PCT No.: PCT/JP2021/013768

§ 371 (c)(1),
(2) Date: Sep. 26, 2023

(87) PCT Pub. No.: WO2022/208704

PCT Pub. Date: Oct. 6, 2022

(65) Prior Publication Data

US 2024/0306413 A1 Sep. 12, 2024

(51) Int. Cl.
*H10K 50/10* (2023.01)
*C09K 11/08* (2006.01)
(Continued)

(52) U.S. Cl.
CPC .......... *H10K 50/10* (2023.02); *C09K 11/0811* (2013.01); *H10K 50/115* (2023.02);
(Continued)

(58) Field of Classification Search
CPC ...... H10K 50/10; H10K 50/115; H10K 50/15; H10K 50/16; H10K 71/60; H10K 2102/351; C09K 11/0811; H05B 33/10; H05B 33/14
See application file for complete search history.

(56) References Cited

U.S. PATENT DOCUMENTS

2009/0159849 A1 6/2009 Uehara et al.
2010/0283037 A1* 11/2010 Omata ................ C09K 11/621 257/14

(Continued)

FOREIGN PATENT DOCUMENTS

WO 2007/060889 A1 5/2007
WO WO-2020213094 A1 * 10/2020 .......... H10K 50/115

OTHER PUBLICATIONS

Official Communication issued in International Patent Application No. PCT/JP2021/013768, mailed on May 25, 2021.

(Continued)

*Primary Examiner* — Shahan Ur Rahaman

(74) *Attorney, Agent, or Firm* — Keating & Bennett, LLP

(57) ABSTRACT

A light-emitting element includes an anode electrode, a QD layer containing QDs, and a cathode electrode, in which the QDs have a core-shell structure including a core and a shell and are Cd-free QDs that emit blue light, the QDs contain halogen elements, and an external quantum efficiency percentage of the light-emitting element is 7% or more.

12 Claims, 14 Drawing Sheets

(51) Int. Cl.

*H10K 50/115* (2023.01)
*H10K 50/15* (2023.01)
*H10K 50/16* (2023.01)
*H10K 71/60* (2023.01)
*H10K 102/00* (2023.01)

(52) U.S. Cl.

CPC ............. *H10K 50/15* (2023.02); *H10K 50/16* (2023.02); *H10K 71/60* (2023.02); *H10K 2102/351* (2023.02)

(56) References Cited

U.S. PATENT DOCUMENTS

| | | | | |
|---|---|---|---|---|
| 2020/0174288 | A1* | 6/2020 | Kim | C09K 11/70 |
| 2021/0091327 | A1* | 3/2021 | Kim | C09K 11/02 |
| 2021/0095205 | A1* | 4/2021 | Ahn | C01G 9/08 |
| 2022/0199925 | A1* | 6/2022 | Kobashi | G09F 9/33 |

OTHER PUBLICATIONS

Lesnyak et al., "Cu Vacancies Boost Cation Exchange Reactions in Copper Selenide Nanocrystals", Journal of the American Chemical Society, Jul. 3, 2015, pp. 9315-9323.

Mirnajafizadeh et al., "Hydrothermal synthesis of highly luminescent blue-emitting ZnSe(S) quantum dots exhibiting low toxicity", Materials Science and Engineering C 64, Mar. 23, 2016, pp. 167-172.

Ippen et al., "ZnSe/ZnS quantum dots as emitting material in blue QD-LEDs with narrow emission peak and wavelength tunability", Organic Electronics, Nov. 15, 2013, pp. 126-131.

* cited by examiner

| | Synthesis Example 1 | Synthesis Example 2 | Synthesis Example 3 | Synthesis Example 4 | Synthesis Example 5 |
|---|---|---|---|---|---|
| Acidic compound | HCl | HCl | HBr | TFA | TFA |
| Zinc halide compound | $ZnCl_2$ | $ZnBr_2$ | $ZnBr_2$ | $ZnCl_2$ | $ZnBr_2$ |
| Fluorescence wavelength (nm) | 441.5 | 442.5 | 440.5 | 441.5 | 442.0 |
| Half width (nm) | 15.0 | 15.1 | 14.4 | 14.0 | 14.7 |
| QY (%) | 96 | 98 | 70 | 78 | 76 |
| Shell thickness (nm) | 2.0 | 2.2 | 2.0 | 2.5 | 2.0 |
| EQE (%) | 18.6 | 13.0 | – | 9.7 | 10.9 |
| SEM | | | | | |

FIG. 9

ELECTROLUMINESCENT ELEMENT, LIGHT-EMITTING DEVICE, AND METHOD FOR PRODUCING ELECTROLUMINESCENT ELEMENT

TECHNICAL FIELD

The disclosure relates to electroluminescent elements and light-emitting devices containing Cd-free quantum dots having a core-shell structure, and methods for manufacturing the electroluminescent elements.

BACKGROUND ART

In recent years, various features related to electroluminescent elements containing quantum dots (quantum dot phosphor particles) have been developed. An example of such electroluminescent elements is a quantum dot light-emitting diode (QLED).

Quantum dots containing cadmium (Cd) are commonly used as the quantum dots. However, Cd is internationally regulated due to its negative impact on the environment, and thus barriers for practical use are high.

Therefore, in recent years, the development of Cd-free quantum dots that do not use Cd has also been examined. For example, chalcopyrite quantum dots such as $CuInS_2$ quantum dots and indium phosphide (InP) quantum dots such as $AgInS_2$ quantum dots (e.g., see PTL 1) or ZnSe quantum dots (e.g., see NPLs 1 to 3) are under development.

CITATION LIST

Patent Literature

PTL 1: WO 2007/060889
NPL 1: Organic Electronics 15 (2014) 126-131
NPL 2: Materials Science and Engineering C 64 (2016) 167-172
NPL 3: J. Am. Chem. Soc. (2015) 137 29 9315-9323

SUMMARY

Technical Problem

However, currently developed chalcopyrite quantum dots and InP quantum dots commonly have a wide fluorescence full-width at half-maximum and are not suitable as blue light-emitting quantum dots.

NPL 1 describes in detail a method for directly synthesizing ZnSe using diphenylphosphine selenide, which is considered to have relatively high reactivity with organic zinc compounds, as a method for synthesizing ZnSe quantum dots. However, quantum dots obtained by the synthesis method described in NPL 1 are not suitable as blue fluorescent quantum dots.

NPL 2 reports a method for synthesizing ZnSe in an aqueous system. Although reaction proceeds at a low temperature, quantum dots obtained by a synthesis method described in NPL 2 have a slightly wide fluorescence full-width at half-maximum of 30 nm or more and a fluorescence wavelength of less than 430 nm. Thus, the quantum dots obtained by the synthesis method described in NPL 2 are not suitable for use as a substitute for known blue LEDs to achieve a wider color gamut.

NPL 3 reports a method for synthesizing ZnSe quantum dots by forming a precursor such as copper selenide (CuSe) and then cation-exchanging copper with zinc (Zn). However, it can be seen that copper remains in the ZnSe quantum dots after cation exchange because particles of copper selenide, which is the precursor, are as large as 15 nm and reaction conditions for cation exchange of copper and zinc are not optimal. According to study results by the inventors, ZnSe quantum dots with residual copper cannot emit light, or even when they emit light, the emission is derived from defects, and a half width of an emission spectrum is 30 nm or more. A particle size of the copper selenide, which is the precursor, also affects the residual copper, and when the particles are large, copper tends to remain even after cation exchange. Thus, even when X-ray diffraction (XRD) confirms ZnSe, a small amount of copper residue is often a factor in failure to emit light. Thus, NPL 3 is cited as an example in which copper remains due to lack of particle size control of the precursor and optimization of the cation exchange method. Therefore, blue fluorescence has not been reported. As described above, there are many reports on the cation exchange method, but there are no reports on strong luminescence for the reason described above.

External quantum efficiency (EQE) of an electroluminescent element in which Cd-free quantum dots are used is lower than external quantum efficiency of an electroluminescent element in which Cd-containing quantum dots are used. In particular, the external quantum efficiency of an electroluminescent element in which Cd-free quantum dots that emit blue light are used is significantly lower than the external quantum efficiency of an electroluminescent element in which Cd-containing quantum dots are used. The external quantum efficiency is calculated by the following equation (1).

$$\text{External quantum efficiency } (EQE) = (\text{carrier balancing}) \times (\text{generation efficiency of luminescent excitons}) \times (\text{luminous quantum efficiency (fluorescence quantum efficiency } (QY))) \times (\text{light extraction efficiency}) \quad (1)$$

Here, since the light extraction efficiency is commonly 0.2 to 0.3, the theoretical external quantum efficiency percentage is 20 to 30%, assuming that the carrier balancing, the generation efficiency of the luminescent excitons, and the fluorescence quantum efficiency are all 1 (100%). Thus, in order to obtain high EQE, quantum dots having high QY are required.

An aspect of the disclosure has been made in view of the above-described problems, and intended to provide an electroluminescent element and a light-emitting device containing Cd-free quantum dots that emit blue light and having higher external quantum efficiency than known ones, and a method for manufacturing the electroluminescent element.

Solution to Problem

To solve the problems described above, an electroluminescent element according to an aspect of the disclosure includes a first electrode, a second electrode, and a quantum dot light-emitting layer containing a quantum dot and provided between the first electrode and the second electrode, in which the quantum dot is a Cd-free quantum dot having a core-shell structure including a core and a shell and configured to emit blue light, the quantum dot contains a halogen element, and an external quantum efficiency percentage of the electroluminescent element is 7% or more.

To solve the problems described above, an electroluminescent element according to an aspect of the disclosure includes a first electrode, a second electrode, and a quantum dot light-emitting layer containing a quantum dot and provided between the first electrode and the second electrode, in which the quantum dot is a Cd-free quantum dot having a core-shell structure including a core and a shell and configured to emit blue light, the quantum dot contains a halogen element, and the quantum dot has a fluorescence quantum efficiency percentage of 70% or more.

An electroluminescent element includes a first electrode, a second electrode, and a quantum dot light-emitting layer containing a quantum dot and provided between the first electrode and the second electrode, in which the quantum dot is a Cd-free quantum dot having a core-shell structure including a core and a shell and configured to emit blue light, the shell is formed by blending a shell material with an acidic compound and a zinc halide compound, and the quantum dot contains a halogen element.

To solve the problems described above, a light-emitting device according to an aspect of the disclosure includes at least one electroluminescent element according to an aspect of the disclosure.

To solve the problems described above, a method for manufacturing an electroluminescent element according to an aspect of the disclosure, the electroluminescent element includes a first electrode, a second electrode, and a quantum dot light-emitting layer containing a quantum dot being Cd-free containing a halogen element, and provided between the first electrode and the second electrode, the method includes forming the first electrode, forming the quantum dot light-emitting layer containing the quantum dot, forming the second electrode, and synthesizing the quantum dot prior to the forming the quantum dot light-emitting layer, in which the synthesizing the quantum dot include producing a core, and forming a shell on a surface of the core, and in the forming a shell, a raw material for the shell is blended with an acidic compound and a zinc halide compound.

Advantageous Effects of Disclosure

According to an aspect of the disclosure, an electroluminescent element and a light-emitting device containing Cd-free quantum dots that emit blue light and have higher external quantum efficiency than known ones, and a method for manufacturing the electroluminescent element can be provided.

BRIEF DESCRIPTION OF DRAWINGS

FIG. 9 is a diagram showing measurement results of quantum dots in Synthesis Examples 1 to 5 and external quantum efficiency percentages of the light-emitting elements using these quantum dots.

DESCRIPTION OF EMBODIMENTS

First Embodiment

The electroluminescent element (hereinafter, simply denoted by "light-emitting element") according to the present embodiment will be described as follows. Note that, in the following, a description of "from A to B" for two numbers A and B is intended to mean "equal to or greater than A and equal to or less than B" unless otherwise specified.

Structural Example of Light-Emitting Element

The light-emitting element according to the present embodiment includes a first electrode, a second electrode, and a function layer including at least a quantum dot light-emitting layer containing quantum dots (hereinafter, simply referred to as "quantum dot layer") provided between the first electrode and the second electrode. One and the other of the first electrode and the second electrode are an anode electrode and a cathode electrode. Quantum dots emit light in accordance with combination of positive holes (holes) supplied from the anode electrode (anode) and electrons (free electrons) supplied from the cathode electrode (cathode). Note that, in the present embodiment, the layers between the anode electrode and the cathode electrode are collectively referred to as a function layer.

Examples of the light-emitting element include a quantum dot light-emitting diode (QLED). Note that hereinafter, a quantum dot is abbreviated as "QD". Therefore, the quantum dot layer (quantum dot light-emitting layer) is abbreviated as a "QD layer (QD light-emitting layer)".

Figure 1:
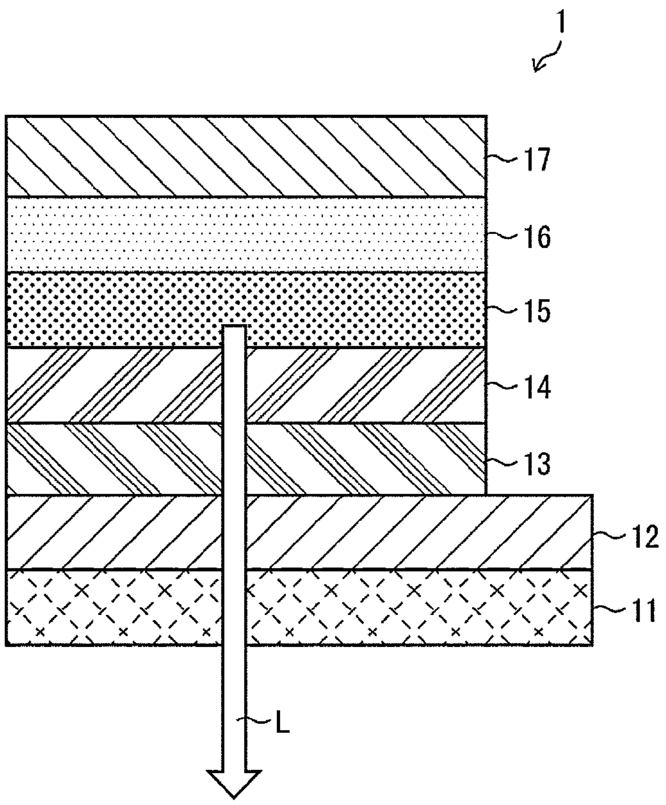
FIG. 1 is a cross-sectional view schematically illustrating an example of an overall configuration of a light-emitting element according to a first embodiment.

FIG. 1 is a cross-sectional view schematically illustrating an example of an overall configuration of a light-emitting element 1 according to the present embodiment.

As illustrated in FIG. 1, the light-emitting element 1 includes an anode electrode 12 (anode), a cathode electrode 17 (cathode), and a function layer provided between the anode electrode 12 and the cathode electrode 17. The function layer includes at least a QD layer 15 (QD light-emitting layer) containing QDs.

The function layer may be a single layer type formed only of the QD layer 15, or may be a multi-layer type including a function layer in addition to the QD layer 15. Of the function layer, examples of function layers besides the QD layer 15 include a hole injection layer (hereinafter, denoted by "HIL"), a hole transport layer (hereinafter, denoted by "HTL"), and an electron transport layer (hereinafter, denoted by "ETL").

Note that in the disclosure, a direction from the anode electrode 12 to the cathode electrode 17 in FIG. 1 is referred to as an upward direction, and the opposite direction thereof is referred to as a downward direction. In the disclosure, a horizontal direction is a direction (main surface direction of each portion included in the light-emitting element 1) perpendicular to a vertical direction. The vertical direction can also be referred to as a normal direction of each portion described above.

Each layer from the anode electrode 12 to the cathode electrode 17 is generally supported by a substrate used as a support body. Accordingly, the light-emitting element 1 may be provided with a substrate as a support body.

As one example, the light-emitting element 1 illustrated in FIG. 1 has a configuration in which a substrate 11, the anode electrode 12, an HIL 13, an HTL 14, the QD layer 15, an ETL 16, and the cathode electrode 17 are layered in this order towards the upward direction of FIG. 1.

Hereinafter, each layer described above will be described in greater detail.

The substrate 11 is a support body for forming each layer from the anode electrode 12 to the cathode electrode 17, as described above.

Note that the light-emitting element 1 may be used, for example, as a light source of an electronic device such as a display device. When the light-emitting element 1 is a part of a display device, for example, a substrate of the display device is used as the substrate 11. Thus, the light-emitting element 1 may be referred to as the light-emitting element 1 including the substrate 11, or may be referred to as the light-emitting element 1 not including the substrate 11.

In this manner, the light-emitting element 1 itself may include a substrate 11, or the substrate 11 of the light-emitting element 1 may be a substrate of an electronic device such as a display device provided with the light-emitting element 1. When the light-emitting element 1 is a part of a display device, for example, an array substrate on which a plurality of thin film transistors are formed may be used as the substrate 11. In this case, the anode electrode 12, which is a first electrode provided on the substrate 11, may be electrically connected to the thin film transistors (TFTs) of the array substrate.

In the case where the light-emitting element 1 is, for example, a part of a display device in this manner, the light-emitting element 1 is provided as a light source on the substrate 11 for each pixel. Specifically, a red pixel (R pixel) is provided with, as a red light source, a light-emitting element (red light-emitting element) that emits red light. A green pixel (G pixel) is provided with, as a green light source, a light-emitting element (green light-emitting element) that emits green light. A blue pixel (B pixel) is provided with, as a blue light source, a light-emitting element (blue light-emitting element) that emits blue light. Accordingly, a bank partitioning the pixels may be formed as a pixel separation film such that the light-emitting elements can be formed on the substrate 11 for each R pixel, G pixel, and B pixel (i.e., RGB patterning can be performed).

In a bottom-emitting (BE) type light-emitting element having a BE structure, light emitted from the QD layer 15 is emitted downward (i.e., towards the substrate 11 side). In a top-emitting (TE) type light-emitting element having a TE structure, light emitted from the QD layer 15 is emitted upward (i.e., towards the side opposite the substrate 11). In a double-sided light-emitting element, the light emitted from the QD layer 15 is emitted downward and upward.

In a case where the light-emitting element 1 is a BE type light-emitting element or a double-sided light-emitting element, the substrate 11 is constituted of a transparent substrate having relatively high translucency such as a glass substrate, for example.

On the other hand, in a case where the light-emitting element 1 is a TE type light-emitting element, the substrate 11 may be constituted of a substrate having relatively low translucency such as a plastic substrate, or may be constituted of a light-reflective substrate having light reflectivity, for example. Note that, the TE structure has few light blocking elements such as TFTs on the light-emitting face, so that the aperture ratio can be made high and the external quantum efficiency (EQE) can be made even higher.

Of the anode electrode 12 and the cathode electrode 17, the electrode on the light output face side must be light-transmissive. Also note that the electrode of the side opposite the light output face may or may not be light-transmissive.

For example, when the light-emitting element 1 is a BE-type light-emitting element, the electrode on the upper-layer side is a light reflective electrode, and the electrode on the lower-layer side is a light-transmissive electrode. When the light-emitting element 1 is a TE-type light-emitting element, the electrode on the upper-layer side is a light-transmissive electrode, and the electrode on the lower-layer side is a light reflective electrode. Note that the light reflective electrode may be a layered body of a layer formed of a light-transmissive material and a layer formed of a light-reflective material.

In FIG. 1, as one example, a case is illustrated in which the light-emitting element 1 is the BE type light-emitting element in which the anode electrode 12 is used as the electrode on the lower-layer side (lower-layer electrode), the cathode electrode 17 is used as the electrode on the upper-layer side (upper-layer electrode), and light L emitted from the QD layer 15 is emitted downward. Therefore, a light-transmissive electrode is used as the anode electrode 12 such that the light L emitted from the QD layer 15 can pass through the anode electrode 12. Further, a light reflective electrode is used as the cathode electrode 17 such that the light L emitted from the QD layer 15 is reflected.

The anode electrode 12 is an electrode that supplies positive holes (holes) to the QD layer 15 when a voltage is applied. The anode electrode 12 is made of, for example, a material having a relatively large work function. Examples of the material include tin-doped indium oxide (ITO), zinc-doped indium oxide (IZO), aluminum-doped zinc oxide (AZO), gallium-doped zinc oxide (GZO), and antimony-doped tin oxide (ATO). A single type of these materials may be used alone, or two or more types may be mixed and used, as appropriate.

The cathode electrode 17 is an electrode that supplies electrons to the QD layer 15 when a voltage is applied to the cathode electrode 17. The cathode electrode 17 is made of, for example, a material having a relatively small work function. Examples of the material include aluminum (Al), silver (Ag), barium (Ba), ytterbium (Yb), calcium (Ca), lithium (Li)—Al alloys, magnesium (Mg)—Al alloys, Mg—Ag alloys, Mg-indium (In) alloys, and Al-aluminum oxide ($Al_2O_3$) alloys.

The HIL 13 is a layer that transports positive holes supplied from the anode electrode 12 to the HTL 14. A hole transport material is used for a material of the HIL 13. The hole transport material may be an organic material or an inorganic material. When the hole transport material is the organic material, examples of the organic material include an electrically conductive polymer material. As the polymer material, for example, a composite (PEDOT:PSS) of poly (3,4-ethylenedioxythiophene) (PEDOT) and polystyrene sulfonic acid (PSS) can be used. Only one type of these hole transport materials may be used, or two or more types thereof may be appropriately mixed and used. The HIL 13 preferably contains PEDOT:PSS among the above-described polymer materials. Thus, the light-emitting element

1 that has high hole mobility and can obtain favorable light-emission characteristics can be provided.

The HTL 14 is a layer that transports positive holes supplied from the HIL 13, to the QD layer 15. A hole transport material is used for a material of the HTL 14. The hole transport material may be an organic material or an inorganic material. In general, the organic material is used. When the hole transport material is the organic material, examples of the organic material include an electrically conductive polymer material. As the polymer material, for example, poly[(9,9-dioctylfluorenyl-2,7-diyl)-co-(4,4'-(N-(4-sec-butylphenyl) diphenylamine))] (TFB) and poly(N-vinylcarbazole) (PVK) can be used. Only one type of these hole transport materials may be used, or two or more types thereof may be appropriately mixed and used.

Of the above-described hole transport materials, the HTL 14 preferably contains PVK. By containing PVK, the light-emitting element 1 having even higher external quantum efficiency (EQE) can be obtained as demonstrated in Example 1 described below.

Note that, in a case where positive holes can be sufficiently supplied to the QD layer 15 only by the HTL 14, the HIL 13 need not be provided.

The ETL 16 is a layer that transports electrons supplied from the cathode electrode 17 to the QD layer 15. An electron transport material is used for a material of the ETL 16. The electron transport material may be an organic material or an inorganic material. When the electron transport material is the organic material, the organic material preferably contains at least one type of compound selected from the group consisting of 1,3,5-tris(1-phenyl-1H-benzimidazol-2-yl)benzene (TPBi), 3-(biphenyl-4-yl)-5-(4-tert-butylphenyl)-4-phenyl-4H-1,2,4-triazole (TAZ), bathophenanthroline (Bphen), and tris(2,4,6-trimethyl-3-(pyridin-3-yl)phenyl)borane (3TPYMB), for example. A single type of these organic materials may be used alone, or two or more types may be mixed and used, as appropriate.

When the electron transport material is the inorganic material, the inorganic material is preferably nanoparticles composed of a metal oxide containing at least one element selected from the group consisting of zinc (Zn), magnesium (Mg), titanium (Ti), silicon (Si), tin (Sn), tungsten (W), tantalum (Ta), barium (Ba), zirconium (Zr), aluminum (Al), yttrium (Y), and hafnium (Hf). Only one type of these electron transport materials may be used, or two or more types thereof may be appropriately mixed and used.

Among the above-described electron transport materials, the ETL 16 preferably contains at least one of zinc oxide (ZnO) and lithium-doped zinc oxide (LiZnO). By containing at least one of ZnO and LiZnO, the light-emitting element 1 having even higher external quantum efficiency (EQE) can be obtained as demonstrated in Example 1 described below.

The QD layer 15 is a layer that contains the QDs as the light-emitting material and emits the light L as a result of a combination of the positive holes supplied from the anode electrode 12 and the electrons (free electrons) supplied from the cathode electrode 17. That is, the QD layer 15 emits light through electroluminescence (EL). More specifically, the QD layer 15 emits light through injection type EL.

The QDs are inorganic nanoparticles composed of about several thousands to several tens of thousands of atoms and having a particle size of about several nm to a dozen nm. The QDs emit fluorescence and are nano order in size, and thus the QDs are also referred to as fluorescent nanoparticles or QD phosphor particles. A composition of the QDs is derived from a semiconductor material, and thus the QDs are also referred to as semiconductor nanoparticles. The QDs have a structure having a specific crystal structure, and thus the QDs are also referred to as nanocrystals. Thus, the QD layer (QD light-emitting layer) is also referred to as, for example, a QD phosphor layer.

Figure 2:
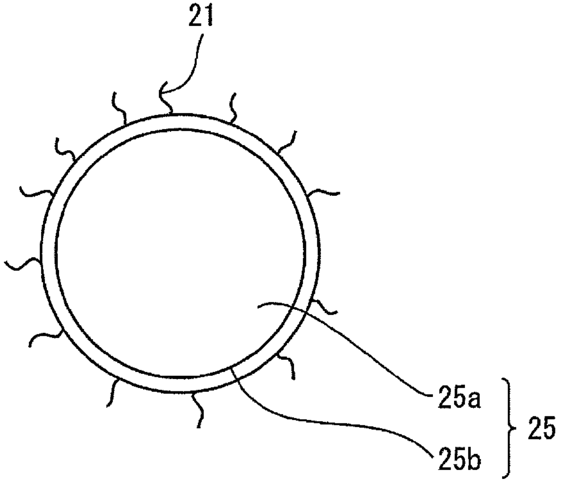
FIG. 2 is a schematic view illustrating an example of a quantum dot according to the first embodiment.
Figure 3:
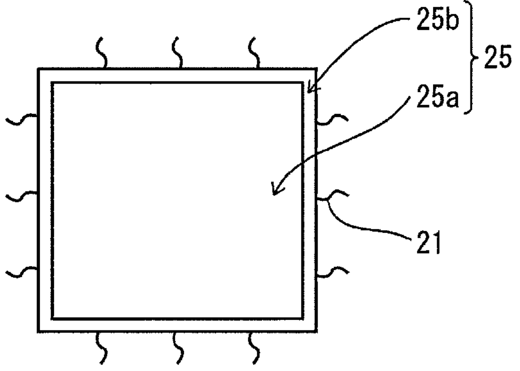
FIG. 3 is a schematic view illustrating another example of a quantum dot according to the first embodiment.

The light-emitting element 1 contains, for example, a QD 25 illustrated in FIG. 2 or 3 as QDs in the QD layer 15. FIGS. 2 and 3 are schematic views illustrating examples of the QDs 25 according to the present embodiment.

The QDs 25 according to the present embodiment are Cd-free nanocrystals that do not substantially contain Cd.

As illustrated in FIGS. 2 and 3, each QD 25 according to the present embodiment has a core-shell structure including a core **25*a* and a shell 25*b***.

The shell **25*b* is provided on a surface of the core 25*a* and covers at least part of the surface of the core 25*a*. Note that it is particularly desirable that the shell 25*b* cover an entire surface of the core 25*a***.

The QD 25 can be said to have a core-shell structure when it is found that the shell **25*b* surrounds the core 25*a* by observing one cross section of the QD 25. For example, from cross-section observation of 50 QDs 25 adjacent to each other, a mean value of diameters of circles having areas corresponding to areas of cross-sections of the QDs 25 (assumed dot diameter) is calculated. At this time, when a difference between the assumed dot diameter and the assumed core diameter is 0.3 nm or more, it can be said that the shell 25*b* envelops the core 25*a* (covers the entire core 25*a***). Note that the cross-section observation can be performed with, for example, a scanning transmission electron microscope (STEM).

Note that, in the disclosure, the term "nanocrystal" refers to a nanoparticle having a particle size from about several nm to several tens of nm. In the present embodiment, a large number of QDs 25 can be produced with a substantially uniform particle size.

Further, in the disclosure, "not substantially contain Cd" or "Cd-free" means that the QD 25 (i.e., the core **25*a* and the shell 25*b***) does not contain Cd at a mass ratio of 1/30 or greater in relative to Zn.

In the present embodiment, the core **25*a* is preferably a nanocrystal containing at least zinc (Zn) and selenium (Se). The core 25*a* may further contain at least one of tellurium (Te) and sulfur (S). However, the core 25*a* desirably does not substantially contain Cd as described above. In addition to Cd, the core 25*a*** preferably does not contain indium (In).

Similarly to the core **25*a*, the shell 25*b* desirably does not substantially contain Cd, and preferably does not contain Cd or In. Thus, it is preferable to use a raw material that does not contain Cd or In as a raw material for the core 25*a* and a raw material for the shell 25*b***.

In the present embodiment, the shell **25*b* contains a large amount of Zn. To be specific, the shell 25*b* preferably contains at least one selected from the group consisting of zinc sulfide (ZnS), zinc selenide (ZnSe), and zinc selenide sulfide (ZnSeS). Among them, ZnS is preferable. Note that the shell 25*b* may be in a solid solution state on the surface of the core 25*a***.

Examples of indicators of QD performance include fluorescence quantum efficiency and a fluorescence full-width at half-maximum (FWHM). In the present embodiment, by making the QD 25 have the core-shell structure as described above, an increase in the fluorescence quantum efficiency can be expected while keeping the fluorescence full-width at half-maximum narrow.

In the QD 25 according to the present embodiment, an entire surface of the core **25*a* can be covered with the shell 25*b* containing Zn and S (sulfur) such as ZnS with a predetermined thickness. The shell 25*b* may have a layered structure of two or more layers. As an example of the shell 25*b*, the shell 25*b*** may be presented with a structure in which a shell layer containing Zn and S (sulfur), such as ZnS, is layered on a shell layer containing Zn, Se, and S, such as ZnSeS.

The QD 25 may be circular in cross section as illustrated in FIG. 2 or polygonal in cross section as illustrated in FIG. 3. When the cross section is polygonal, the polygonal shape is preferably, for example, substantially rectangular or substantially triangular. In the present embodiment, the core **25*a* of the QD 25 preferably contains at least Zn and Se, so that the core 25*a*, which is a component of the QD 25, is likely to be formed into a polyhedron (e.g., substantially cubic) by crystal growth. That is, in the present embodiment, the QDs 25 are not irregularly shaped, but can be formed in an excellent shape, a uniform particle shape. In the present embodiment, the core 25*a* can be entirely surrounded by the shell 25*b*** having a substantially constant thickness.

Although not limited, in the present embodiment, the shell **25*b* can be formed with a layer thickness of about 0.5 mm or more and 3 mm or less, preferably 1 mm or more and 2.5 mm or less. This is because a raw material of the shell 25*b*** (shell material) is blended with an acidic compound, as will be described later in a manufacturing method.

In the present embodiment, the shell material is blended with a zinc halide compound. This can improve the fluorescence quantum efficiency (QY) of the QDs 25.

As illustrated in FIGS. 2 and 3, numerous ligands 21 are preferably coordinated (adsorbed) on the surface of the QD 25 as ligands. The ligand 21 is a surface-modifying group that modifies the surface of the QD 25. The QD layer 15 formed by the solution method contains the spherical QDs 25 and the ligands 21. By coordinating the ligands 21 on the surfaces of the QDs 25, aggregation of the QDs 25 can be suppressed, and thus target optical characteristics are easily exhibited. The ligands 21 that can be used for reaction (i.e., the ligands 21 to be coordinated to the surface of QD 25) are not limited, but are preferably organic ligands.

The organic ligands are not limited, and representative examples thereof include amine-based (e.g., aliphatic primary amine-based), fatty acid-based, thiol-based, phosphine-based, phosphine oxide-based, and alcohol-based ligands.

Examples of the amine-based ligands 21 include aliphatic primary amine-based ligands. Examples of the aliphatic primary amine-based ligands include oleylamine ($C_{18}H_{35}NH_2$), stearyl (octadecyl) amine ($C_{18}H_{37}NH_2$), dodecyl (lauryl) amine ($C_{12}H_{25}NH_2$), decylamine ($C_{10}H_{21}NH_2$), and octylamine ($C_8H_{17}NH_2$).

Examples of the fatty acid-based ligands 21 include oleic acid ($C_{17}H_{33}COOH$), stearic acid ($C_{17}H_{35}COOH$), palmitic acid ($C_{15}H_{31}COOH$), myristic acid ($C_{13}H_{27}COOH$), lauric (dodecanoic) acid ($C_{11}H_{23}COOH$), decanoic acid ($C_9H_{19}COOH$), and octanoic acid ($C_7H_{15}COOH$).

Examples of the thiol-based ligands 21 include octadecanethiol ($C_{18}H_{37}SH$), hexanedecanethiol ($C_{16}H_{33}SH$), tetradecanethiol ($C_{14}H_{29}SH$), dodecanethiol ($C_{12}H_{25}SH$), decanethiol ($C_{10}H_{21}SH$), and octanethiol ($CH_{17}SH$).

Examples of the phosphine-based ligands 21 include trioctylphosphine ($(C_8H_{17})_3P$), triphenylphosphine ($(C_6H_5)_3P$), and tributyl phosphine ($(C_4H_9)_3P$).

Examples of the phosphine oxide-based ligands 21 include trioctylphosphine oxide ($(C_8H_{17})_3P{=}O$), triphenylphosphine oxide ($(C_6H_5)_3P{=}O$), and tributyl phosphine oxide ($(C_4H_9)_3P{=}O$).

Examples of the alcohol-based ligands 21 include oleyl alcohol ($C_{18}H_{36}O$).

Addition of the amine-based ligands 21 or thiol-based ligands 21 out of these ligands 21, can greatly improve stability of the light-emission characteristics of the QDs 25.

Inorganic ligands are preferably coordinated with organic ligands on the surface of the QD 25. Accordingly, defects on the surfaces of the QDs 25 can be further suppressed, and higher optical characteristics can be exhibited.

The inorganic ligands are not limited, and representative examples thereof include halogens such as fluorine (F), chlorine (Cl), bromine (Br), and iodine (I).

In the present embodiment, as will be described later, the shell **25*b* is formed by forming a film using a shell material blended with an acidic compound or both an acidic compound and a zinc halide compound. A raw material containing a halogen element may be used to form the core 25*a*. Thus, at least the shell 25*b* of the QD 25** contains halogen elements.

In the QDs 25 according to the present embodiment, as a result of elemental analysis by energy dispersive X-ray spectroscopy (EDX), in addition to Zn, Se, and S, halogen elements are also detected. The halogen elements are preferably Cl or Br.

A content of the halogen elements is not limited, and is sufficiently smaller than that of Zn, Se, and S and is about 0.01 atom % or more and 5 atom % or less. The content of the halogen elements is preferably about 0.5 atom % or more and 2 atom % or less. "atom %" is a ratio to the total number of atoms when the total number of atoms constituting the QD 25 is 100. An amount of halogen elements can be measured by EDX analysis.

According to the present embodiment, by using the QDs 25 in the QD layer 15 of the light-emitting element 1, the external quantum efficiency (EQE) of the light-emitting element 1 can be effectively improved. According to the present embodiment, the light-emitting element 1 having an EQE percentage of 7% or more can be obtained. The light-emitting element 1 preferably has an EQE percentage of 9% or more, more preferably 9.5% or more, still more preferably 10% or more, and yet still more preferably 10.5% or more. EQE can be evaluated using an LED measuring device and is determined by the maximum value.

The EQE of the light-emitting element 1 can be improved by increasing the QY of the QDs 25, as described using the equation (1). Thus, in order to obtain the light-emitting element 1 with high EQE, it is preferable to increase the QY of the QDs 25. According to the present embodiment, the QY percentage of the QDs 25 can be 70% or more, preferably 75% or more, more preferably 80% or more, even more preferably 85% or more, still more preferably 90% or more, and particularly preferably 95% or more.

In the QDs 25 according to the present embodiment, the fluorescence full-width at half-maximum can be preferably narrowed to 20 nm or less. The term "fluorescence full-width at half-maximum" refers to a full-width at half-maximum, which indicates spread of a fluorescence wavelength at half the intensity of a peak value of a fluorescence intensity in a fluorescence spectrum. The fluorescence full-width at half-maximum is preferably 15 nm or less. As described above, in the present embodiment, the fluorescence full-width at half-maximum can be narrowed, and thus a wide color gamut can be achieved.

In the present embodiment, as will be described later, as a reaction system for synthesizing the QDs 25, a copper chalcogenide is synthesized as a precursor, and then a metal exchange reaction is performed on the precursor. By producing the QDs 25 based on such an indirect synthesis reaction, the fluorescence full-width at half-maximum can be narrowed.

In addition, in the present embodiment, a fluorescence lifetime of the QDs 25 can be set to 50 ns or less. Note that, in the disclosure, "fluorescence lifetime" indicates the "time until the initial intensity becomes 1/e (approximately 37%)".

In addition, in the present embodiment, the fluorescence lifetime can be adjusted to 40 ns or less, even 30 ns or less, or even 20 ns or less. In the present embodiment, the fluorescence lifetime can be shortened in this manner, but can also be extended to approximately 50 ns, and thus the fluorescence lifetime can be adjusted according to the intended use.

In the present embodiment, the fluorescence wavelength (emission wavelength) of the QDs 25 can be freely controlled to an approximate range of from 410 nm to 470 nm. The QDs 25 according to the present embodiment are specifically ZnSe-based solid solution. In the present embodiment, the fluorescence wavelength can be controlled by adjusting the particle size and composition of the QDs 25. According to the present embodiment, the fluorescence wavelength can be preferably set to 430 nm or more, and more preferably 440 nm or more. Note that, in the disclosure, "fluorescence peak wavelength" and "emission peak wavelength" are abbreviated as "fluorescence wavelength" and "emission wavelength", respectively.

Thus, in the present embodiment, the fluorescence wavelength of the QDs 25 can be controlled to blue. Therefore, according to the present embodiment, the light-emitting element 1 that emits blue light can be provided.

In the present embodiment, the particle size of the QDs 25 is preferably 2 nm or more, more preferably 3 nm or more, and even more preferably 4 nm or more. On the other hand, the particle size of the QDs 25 is preferably 20 nm or less, more preferably 15 nm or less, and even more preferably 10 nm or less.

The QD layer 15 is preferably formed to have a layer thickness of 20 nm or less, more preferably 10 nm or less. Thus, the light-emitting element 1 that can obtain favorable light-emission characteristics can be provided. The number of overlapping layers of the QDs 25 in the QD layer 15 is, for example, from 1 to 10 layers. Therefore, the lower limit of the layer thickness of the QD layer 15 is substantially equal to the particle size of the QDs 25. Thus, the layer thickness of the QD layer 15 is preferably 2 nm or more, for example.

In the light-emitting element 1, a forward voltage is applied between the anode electrode 12 and the cathode electrode 17. In other words, the anode electrode 12 is set to a higher potential than the cathode electrode 17. Through this, (i) electrons can be supplied from the cathode electrode 17 to the QD layer 15, and (ii) positive holes can be supplied from the anode electrode 12 to the QD layer 15. As a result, the QD layer 15 can generate light L with a recombination of the positive holes and the electrons. The above-described application of voltage may be controlled by a TFT (not illustrated). As an example, a TFT layer including a plurality of TFTs may be formed in the substrate 11.

Note that the light-emitting element 1 may include, as a function layer, a hole-blocking layer (HBL) that suppresses the transport of positive holes. The hole-blocking layer is, as an example, provided between the cathode electrode 17 and the QD layer 15. By providing the hole-blocking layer, the balance of the carriers (that is, positive holes and electrons) supplied to the QD layer 15 can be adjusted.

In addition, the light-emitting element 1 may include, as a function layer, an electron-blocking layer (EBL) that suppresses the transport of electrons. The electron-blocking layer is, as an example, provided between the QD layer 15 and the cathode electrode 17. By providing the electron-blocking layer, the balance of the carriers (that is, positive holes and electrons) supplied to the QD layer 15 can be adjusted.

The light-emitting element 1 may be provided with a sealing member by being sealed after film formation up to the cathode electrode 17 has been completed. For example, a glass or a plastic can be used as a sealing member. The sealing member desirably has, for example, a recessed space so that a layered body from the substrate 11 to the cathode electrode 17 can be sealed. For example, after a sealing adhesive (for example, an epoxy-based adhesive) is applied between the sealing member and the substrate 11, sealing is implemented in a nitrogen ($N_2$) atmosphere, and whereby the light-emitting element 1 is manufactured.

The light-emitting element 1 may have a configuration in which the cathode electrode 17, the ETL 16, the QD layer 15, the HTL 14, the HIL 13, and the anode electrode 12 are layered on the substrate 11 in this order. When the light-emitting element 1 includes the ETL 16 as described above, the light-emitting element 1 may include an electron injection layer (EIL) between the ETL 16 and the cathode electrode 17.

Method for Manufacturing Light-Emitting Element 1

Next, a method for manufacturing the light-emitting element 1 will be described.

Figure 4:
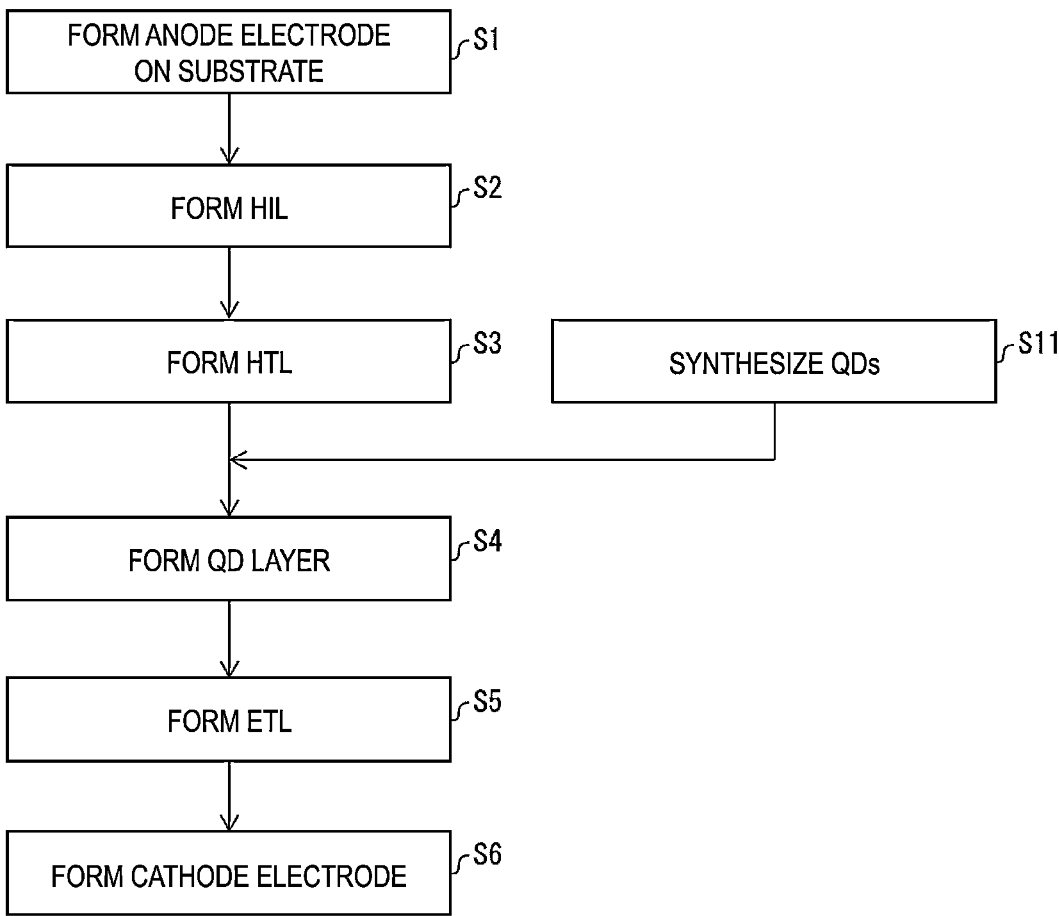
FIG. 4 is a flowchart illustrating an example of an overview of a method for manufacturing the light-emitting element according to the first embodiment.

FIG. 4 is a flowchart illustrating an example of an overview of the method for manufacturing the light-emitting element 1 according to the present embodiment.

As illustrated in FIG. 4, in a manufacturing process of the light-emitting element 1 according to the present embodiment, as an example, for example, the anode electrode 12 is first formed on the substrate 11 (step S1: anode electrode forming step). Subsequently, the HIL 13 is formed on the anode electrode 12 (step S2: HIL forming step). Subsequently, the HTL 14 is formed on the HIL 13 (step S3: HTL forming step). Subsequently, the QD layer 15 is formed on the HTL 14 (step S4: QD layer forming step). Subsequently, the ETL 16 is formed on the QD layer 15 (step S5: ETL forming step). Subsequently, the cathode electrode 17 is formed on the ETL 16 (step S6: cathode electrode forming step). Note that after formation of the cathode electrode 17 in step S6, the layered body (from the anode electrode 12 to the cathode electrode 17) formed on the substrate 11 may be sealed with a sealing member.

For example, physical vapor deposition (PVD) such as a sputtering method or a vacuum vapor deposition technique, a spin coating method, or an ink-jet method is used for formation of the anode electrode 12 in step S1 and formation of the cathode electrode 17 in step S6.

A mask (not illustrated) may be used to form the anode 12 or the cathode 17. Alternatively, each electrode material may be formed into a solid-like film by the method described above and then patterned into a desired shape as necessary.

When the light-emitting element 1 is, for example, a part of a display device, the lower layer electrode is patterned in an island shape for each light-emitting element (i.e., for each pixel) as a patterned electrode. On the other hand, the upper layer electrode is, as a common electrode common to all the light-emitting elements (i.e., all pixels), formed across all pixels. Accordingly, when the light-emitting element 1 illustrated in FIG. 1 is, for example, a part of a display device, the anode electrode 12 may be formed for each pixel by forming the anode electrode material (electrode material) into a solid-like film and then patterning the film.

For example, PVD such as a sputtering method or a vacuum vapor deposition technique, a spin coating method, or an ink-jet method is used for formation of the HIL 13 in step S2 and formation (film formation) of the HTL 14 in step S3. Note that, as described above, in a case where positive holes can be sufficiently supplied to the QD layer 15 only by the HTL 14, the HIL 13 need not be provided.

For the formation (film formation) of the ETL 16 in step S5, when the ETL 16 is made of an organic material, a vacuum vapor deposition technique, a spin coating method, an ink-jet method, or the like is preferably used. When the ETL 16 is made of an inorganic material, for example, PVD such as a sputtering method or a vacuum vapor deposition technique, a spin coating method, or an ink-jet method is used for formation (film formation) of the ETL 16.

When the light-emitting element 1 is, for example, a part of a display device, among the function layers provided between the anode electrode 12 and the cathode electrode 17, the function layers other than the QD layer 15 may be formed in island shapes for the respective light-emitting elements (i.e., for pixels), or may be formed across all pixels as a common layer common to all light-emitting elements (i.e., all pixels).

Therefore, when the HIL 13, the HTL 14, and the ETL 16 are patterned in island shapes, masks (not illustrated) may be used to form the HIL 13, the HTL 14, and the ETL 16, or the respective materials may be formed into solid-like films by the method described above and then patterned into desired shapes as necessary.

A solution method is used to form the QD layer 15 in step S4. Formation of the QD layer 15 by the solution method is performed as follows.

First, a QD dispersion containing the QDs 25 and a solvent is applied to an upper surface of an underlayer (the HTL 14 in the present embodiment). Thus, a coating film containing QDs 25 is formed. Thereafter, the solvent is volatilized to remove. Thus, the QD layer 15 can be formed by solidifying the coating film.

As the solvent described above, an organic solvent such as hexane or toluene can be used. A method of applying the QD dispersion is not limited, and may be any method such as a spin coating method, a bar coating method, or a spraying method. The QD dispersion preferably further contains the ligands 21 described above.

The QDs 25 used in step S4 are manufactured (synthesized) in advance prior to performing step S4. Therefore, as illustrated in FIG. 4, the method for manufacturing the light-emitting element 1 according to the present embodiment includes, for example, steps S1 to S6, and includes a QD synthesis step (step S11) before step S4.

In step S11, the QDs 25 used for the QD dispersion (i.e., the QDs 25 used for forming the QD layer 15) are synthesized (manufactured).

Method for Synthesizing QDs 25

Next, a method for synthesizing the QDs 25 in step S11 (synthesis step) will be described.

The step S11 includes a step of producing the core 25*a* and a step of forming the shell 25*b* on the surface of the core 25*a*. In the step of forming the shell 25*b*, especially, the surface of the core 25*a* is covered with the shell 25*b*. Therefore, hereinafter, the step of forming the shell 25*b* is referred to as a step of covering with the shell 25*b*. In the step of covering with (forming) the shell 25*b*, the shell material is blended with an acidic compound and a zinc halide compound. Details are described below.

Method for Synthesizing Core 25*a*

First, a method for synthesizing the core 25*a* will be described. In the step of producing the core 25*a*, a core containing at least Zn and Se is produced as the core 25*a*.

In the present embodiment, first, a copper chalcogenide as a precursor (copper chalcogenide precursor) is synthesized from a Cu raw material (an organic copper compound or an inorganic copper compound) and an organic chalcogen compound as a Se raw material or Te raw material. Specifically, the copper chalcogenide precursor is preferably at least one selected from the group consisting of CuzSe, CuzSeS, CuzSeTe, and CuzSeTeS.

The organic copper compound (organic copper reagent) used as the Cu raw material is not particularly limited, and examples thereof include acetates and fatty acid salts. Furthermore, the inorganic copper compound (inorganic copper reagent) used as the Cu raw material is also not particularly limited, and examples thereof include halides (copper halides).

More specifically, examples of the acetates include copper (I) acetate (Cu(OAc)) and copper(II) acetate ($Cu(OAc)_2$). Examples of the fatty acid salts include copper stearate ($Cu(OC(=O)C_{17}H_{35})_2$), copper oleate ($Cu(OC(=O)C_{17}H_{33})_2$), copper myristate ($Cu(OC(=O)C_{13}H_{27})_2$), copper dodecanoate ($Cu(OC(=O)C_{11}H_{23})_2$), and copper acetylacetonate ($Cu(acac)_2$). Both monovalent and divalent compounds can be used as the halide. Examples of the halide include copper(I) chloride (CuCl), copper(II) chloride ($CuCl_2$), copper(I) bromide (CuBr), copper(II) bromide ($CuBr_2$), copper(I) iodide (CuI), and copper(II) iodide ($CuI_2$). A single type of these Cu raw materials may be used alone, or two or more types may be mixed and used, as appropriate.

In the present embodiment, an organic selenium compound (organic chalcogen compound) is used as a raw material of Se. The organic selenium compound is not particularly limited, and for example, trioctylphosphine selenide ($(C_8H_{17})_3P=Se$) obtained by dissolving Se in trioctylphosphine, and tributylphosphine selenide ($(C_4H_9)_3P=Se$) obtained by dissolving Se in tributylphosphine can be used. Also, other examples of the organic selenium compound (organic chalcogen compound) that can be used include a solution (Se-ODE) in which Se is dissolved at a high temperature in a high boiling point solvent, which is a long chain hydrocarbon such as octadecene, and a solution (Se-DDT/OLAm) in which Se is dissolved in a mixture of oleylamine and dodecanethiol. A single type of these Se raw materials may also be used alone, or two or more types may be mixed and used, as appropriate.

In the present embodiment, an organic tellurium compound (organic chalcogen compound) is used as the Te raw material. The organic tellurium compound is not particularly limited, and for example, trioctylphosphine telluride ($(C_8H_{17})_3P=Te$) obtained by dissolving Te in trioctylphosphine, and tributylphosphine telluride ($(C_4H_9)_3P=Te$) obtained by dissolving Te in tributylphosphine can be used. Also, as the organic tellurium compound, a dialkyl ditelluride ($R_2Te_2$: where R denotes a C1-C6 alkyl group), such as diphenyl ditelluride ($(C_6H_5)_2Te_2$) can be used. A single type of these Te raw materials may be used alone, or two or more types may be mixed and used, as appropriate.

In the synthesis of the copper chalcogenide precursor, first, an organic copper compound or an inorganic copper compound, and an organic chalcogen compound are mixed and dissolved in a solvent.

Examples of the solvent include saturated or unsaturated hydrocarbons having a high boiling point. Examples of high boiling point saturated hydrocarbons that can be used include n-dodecane, n-hexadecane, and n-octadecane. An example of a high boiling point unsaturated hydrocarbon that can be used is octadecene. Note that, for example, an aromatic solvent having a high boiling point, and an ester-based solvent having a high boiling point may also be used as the solvent. For example, t-butyl benzene can be used as an aromatic solvent having a high boiling point. Examples of high boiling point ester-based solvents that can be used include butyl butyrate ($C_4H_9COOC_4H_9$) and benzyl butyrate ($C_6H_5CH_2COOC_4H_9$). However, aliphatic amine-based compounds, fatty acid-based compounds, aliphatic phosphorus-based compounds, or mixtures thereof can also be used as the solvent.

In the synthesis of the copper chalcogenide precursor, a reaction temperature is set to within a range from 140° C. to 250° C. Note that the reaction temperature is preferably a lower temperature within a range from 140° C. to 220° C., and more preferably an even lower temperature within a range from 140° C. to 200° C. In this manner, according to the present embodiment, the copper chalcogenide can be synthesized at a low temperature, and therefore the copper chalcogenide can be safely synthesized. In addition, since the reaction during synthesis is gentle, the reaction is easier to control.

Note that, in the present embodiment, the reaction method is not particularly limited, but it is important to synthesize CuzSe, CuzSeS, CuzSeTe, and CuzSeTeS having uniform particle diameters in order to obtain the QDs 25 having a narrow fluorescence full-width at half-maximum.

Next, a Zn raw material (an organic zinc compound or an inorganic zinc compound) is prepared as a raw material of ZnSe, ZnSeS, ZnSeTe, or ZnSeTeS. The organic zinc compound and the inorganic zinc compound are raw materials that are stable even in air and easy to handle. The organic zinc compound and the inorganic zinc compound are not particularly limited, but a zinc compound with high ionic properties is preferably used in order to efficiently carry out a metal exchange reaction.

Examples of the organic zinc compound include acetates, nitrates, fatty acid salts, and zinc carbamates. An example of the acetate that can be used is zinc acetate ($Zn(OAc)_2$). An example of the nitrate that can be used is zinc nitrate ($Zn(NO_3)_2$). Examples of fatty acid salts that can be used include zinc stearate ($Zn(OC(=O)C_{17}H_{35})_2$), zinc oleate ($Zn(OC(=O)C_{17}H_{33})_2$), zinc palmitate ($Zn(OC(=O)C_{15}H_{31})_2$), zinc myristate ($Zn(OC(=O)C_{13}H_{27})_2$), zinc dodecanoate ($Zn(OC(=O)C_{11}H_{23})_2$), and zinc acetylacetonate ($Zn(acac)_2$). Examples of zinc carbamates that can be used include zinc diethyldithiocarbamate ($Zn(SC(=S)N(C_2H_5)_2)_2$), zinc dimethyldithiocarbamate ($Zn(SC(=S)N(CH_3)_2)_2$), and zinc dibutyldithiocarbamate ($Zn(SC(=S)N(C_4H_9)_2)_2$). Examples of the inorganic zinc compound include halides (zinc halides). Examples of halides that can be used include zinc chloride ($ZnCl_2$), zinc bromide ($ZnBr_2$), and zinc iodide ($ZnI_2$). A single type of these Zn raw materials may be used alone, or two or more types may be mixed and used, as appropriate.

Subsequently, the above-described organic zinc compound or inorganic zinc compound is added to the reaction solution in which the copper chalcogenide precursor was synthesized. This results in a metal exchange reaction between Cu of the copper chalcogenide and Zn. The metal exchange reaction is preferably carried out at a temperature from 150° C. to 300° C. Further, the metal exchange reaction is more preferably carried out at a lower temperature from 150° C. to 280°, and is even more preferably carried out at a temperature from 150° C. to 250° C. In this manner, in the present embodiment, the metal exchange reaction can be carried out at a lower temperature, and therefore the safety of the metal exchange reaction can be increased. Furthermore, the metal exchange reaction is more easily controlled.

In the present embodiment, preferably, the metal exchange reaction between Cu and Zn proceeds quantitatively, and the nanocrystals do not include the Cu of the precursor. This is because when the Cu of the copper chalcogenide remains in the nanocrystals, the Cu serves as a dopant, and light is emitted by a different emission mechanism, thereby widening the fluorescence full-width at half-maximum. The residual amount of this Cu is preferably 100 ppm or less, more preferably 50 ppm or less, and ideally 10 ppm or less, in relation to the Zn.

ZnSe-based QDs 25 synthesized by a cation exchange method tend to have a higher residual amount of Cu than ZnSe-based QDs 25 synthesized by a direct method. However, even though Cu is included in a range of from 1 to 10 ppm in relation to Zn, excellent light-emission characteristics can be obtained. Note that the residual amount of Cu enables the determination as to whether the QDs 25 are synthesized by the cation exchange method. That is, synthesis by the cation exchange method enables control of the particle size with the copper chalcogenide precursor, thereby enabling the synthesis method that is inherently difficult to react. Therefore, the residual amount of Cu can be used to determine whether the cation exchange method was used.

In the present embodiment, a compound having an auxiliary role of releasing the metal of the copper chalcogenide precursor into the reaction solution by coordination, chelation, or the like is required when metal exchange is carried out.

An example of the compound having the above-described role is a ligand capable of forming a complex with Cu. As this ligand, a ligand similar to the ligands 21 given as examples above can be used. Preferable examples of the ligand include the above-described phosphine-based (phosphorus-based) ligands, amine-based ligands, and thiol-based (sulfur-based) ligands. Among them, phosphine-based (phosphorus-based) ligands are more preferable due to their high reaction efficiency.

Through the use of such ligands, the metal exchange between Cu and Zn is appropriately implemented, and QDs 25 having a narrow fluorescence full-width at half-maximum and based on Zn and Se can be manufactured. In the present embodiment, the QDs 25 can be more easily mass-produced by the above-described cation exchange method than the direct synthesis method.

That is, in the direct synthesis method, for example, an organic zinc compound such as diethylzinc ($Et_2Zn$) is used to increase the reactivity of Zn raw material. However, diethylzinc is highly reactive and ignites in air, and therefore raw material handling and storage are difficult. For example, the material needs to be handled in an inert gas stream. A reaction using diethylzinc also carries risks such as exotherm and ignition, and therefore diethylzinc is not suited for mass production. Likewise, reactions in which, for example, hydrogen selenide ($H_2Se$) is used to increase the reactivity of the Se raw material are also not suited for mass production from the perspectives of toxicity and safety.

In addition, in reaction systems using a Zn raw material and a Se raw material with high reactivity as described above, ZnSe is produced, but particle production is not controlled, and as a result, the fluorescence full-width at half-maximum of the produced ZnSe becomes wider.

In contrast, as described above, in the present embodiment, the copper chalcogenide precursor is synthesized from a Cu raw material (an organic copper compound or an inorganic copper compound) and an organic chalcogen compound. Then, the QDs 25 are synthesized by metal exchange using this copper chalcogenide precursor. Thus, in the present embodiment, the QDs 25 are first synthesized through the synthesis of the copper chalcogenide precursor, and the QDs 25 are not synthesized directly from the raw materials. According to the present embodiment, through this type of indirect synthesis, it is not necessary to use reagents that are too reactive and dangerous to handle, and ZnSe-based QDs 25 having a narrow fluorescence full-width at half-maximum can be safely and stably synthesized.

Furthermore, in the present embodiment, it is not always necessary to isolate and purify the copper chalcogenide precursor. Thus, for example, the QDs 25 with the desired composition and particle size can be obtained by metal exchange between Cu and Zn in one pot. However, the copper chalcogenide precursor may be used once isolated and purified prior to synthesis of the QDs 25.

The QDs 25 synthesized by the above-described technique exhibit fluorescence characteristics without performing various treatments such as washing, isolation and purification, a covering treatment, and ligand exchange.

Method for Synthesizing Shell 25*b*

In the step of covering with (forming) the shell 25*b*, the surface of the core 25*a* is covered with the shell 25*b* containing Zn and S (the shell 25*b* containing Zn and S is formed on the surface of the core 25*a*). An example of a method for forming (i.e., a method for synthesizing) the shell 25*b* will be specifically described below with reference to FIG. 5.

Figure 5:
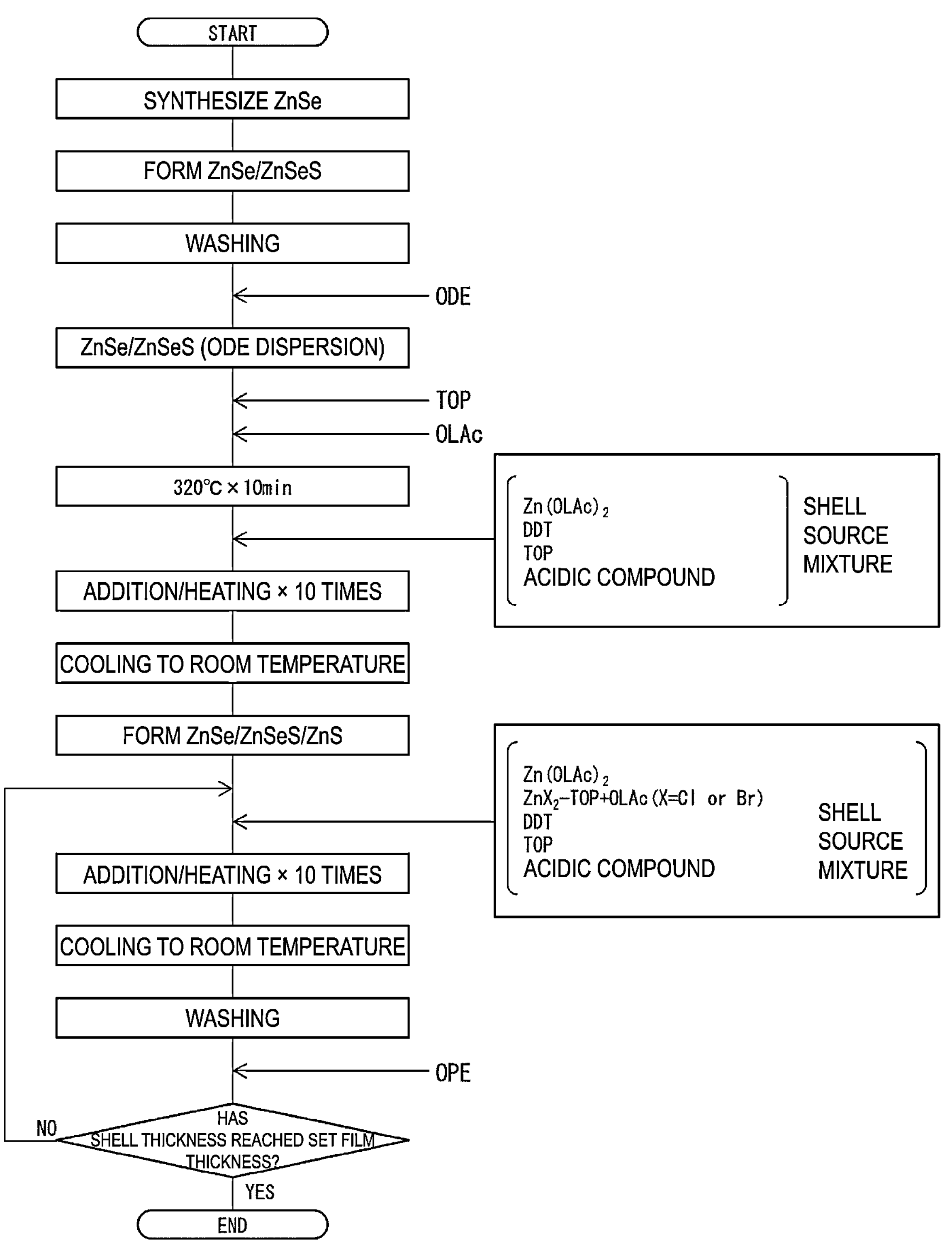
FIG. 5 is a flowchart illustrating a synthesis process of quantum dots according to the first embodiment.

FIG. 5 is a flowchart illustrating a synthesis process of the QDs 25 according to the present embodiment. In the present embodiment, first, as the core 25*a* containing Zn and Se, for example, a core containing ZnSe as a basic component (main component) (hereinafter referred to as "ZnSe core") is synthesized by the method described above. Thereafter, as illustrated in FIG. 5, a surface of the ZnSe core is covered with, as a shell layer (first shell layer) containing Zn, Se, and S, for example, a shell containing ZnSeS as a basic component (main component) (hereinafter referred to as "ZnSeS shell" or "ZnSeS shell layer").

For covering with the ZnSeS shell, for example, a mixture of a Se-TOP solution, a S-TOP solution, and a zinc oleate solution is added to a solution in which the ZnSe cores are dispersed, and a resulting mixture is heated at a predetermined temperature while stirring. By repeating this operation several times, particles in each of which the surface of the ZnSe core is covered with the ZnSeS shell (hereinafter referred to as "ZnSe/ZnSeS" or "ZnSe/ZnSeS particles") are formed. The Se-TOP solution is a solution obtained by dissolving selenium (Se) in trioctylphosphine (TOP). The S-TOP solution is a solution obtained by dissolving sulfur (S) in trioctylphosphine (TOP).

In the present embodiment, ZnSe/ZnSeS is washed and then dispersed in, for example, octadecene (ODE), and TOP and oleic acid (OLAc) are further added thereto, and a resulting mixture is stirred and heated under predetermined heat treatment conditions (e.g., 320° C.×10 minutes).

Subsequently, in the present embodiment, for example, the first layer is covered with a shell containing ZnS as a basic component (main component) (hereinafter referred to as "ZnS shell" or "ZnS shell layer") as a shell layer containing Zn and S (second shell layer).

In the present embodiment, the step of covering with the ZnS shell is preferably performed at least twice (i.e., multiple times). In the present embodiment, in the step of covering with the ZnS shell, the ZnS shell is formed in multiple steps by forming a film on the surface of the core 25*a* using a shell material blended with an acidic compound but not blended with a zinc halide compound and then forming a film using a shell material blended with both an acidic compound and a zinc halide compound.

In the following, a case where the step of covering with the ZnS shell is divided into a first half and a second half will be described as an example.

First, in the first half step of covering with the ZnS shell, a shell source mixture (shell material) blended with an acidic compound is added as a shell source mixture (I) to the solution in which the ZnSe/ZnSeS is dispersed. Specifically, a zinc oleate ($Zn(OLAc)_2$) solution, dodecanethiol (DDT), and TOP are added, and an acidic oxide is further added. In the present embodiment, the shell source mixture (I) containing this acidic oxide is added and a resulting mixture is heated while stirring under predetermined heating conditions. The predetermined heating conditions are, for example, a heating temperature of 320° C. and a heating time of 10 minutes. In the present embodiment, the operation of adding and heating the shell source mixture (I) is repeated multiple times. In FIG. 5, the number of times of repeated operations is described as 10 times, but "10 times" is an example, and the number of times is not limited. However, it is preferable to define the number of repetitions within a range of about 5 times to 15 times. The resulting reaction solution is then cooled to room temperature. Thus, particles in each of which the ZnSe core is covered with a ZnSeS/ZnS shell (hereinafter referred to as "ZnSe/ZnSeS/ZnS" or "ZnSe/ZnSeS/ZnS particles") are synthesized.

As described above, in the present embodiment, the film (coating film) is formed on the surface of the core 25*a* using the shell material blended with the acidic compound and not blended with the zinc halide compound, and then the film (coating film) using the shell material blended with both the acidic compound and the zinc halide compound is formed.

Therefore, when the step of covering with the ZnS shell is divided into the first half and the second half as described above, in the step of covering with the shell in the first half, the acidic compound is added (blended) to the shell source mixture (I), which is the shell material, but the zinc halide compound to be blended in the step of covering with the shell in the second half is not added (blended). It has been found that addition of a zinc halide compound to the shell source mixture in the step of covering with the shell in the first half ultimately decreases the QY. Therefore, in the step of covering with the shell in the first half, no zinc halide compound is added to the shell source mixture (I).

Subsequently, in the present embodiment, the step of covering with the shell in the second half is performed. In the step of covering with the shell in the second half, a shell source mixture containing an acidic compound and a zinc halide compound is added as a shell source mixture (II) to a solution in which ZnSe/ZnSeS/ZnS is dispersed. To this shell source mixture (II), a zinc halide compound and an acidic compound are added together with, for example, a zinc oleate ($Zn(OLAc)_2$) solution, dodecanethiol (DDT), and TOP. Thus, in the step of covering with the shell in the second half, the shell source mixture (II) containing the acidic compound and the zinc halide compound is added and a resulting mixture is heated while stirring under predetermined heating conditions. The predetermined heating conditions are, for example, a heating temperature of 320° C.

and a heating time of 10 minutes. In the present embodiment, the operation of adding and heating the shell source mixture (II) is repeated multiple times. In FIG. 5, the number of times of repeated operations is described as 10 times, but "10 times" is an example, and the number of times is not limited. However, it is preferable to define the number of repetitions within a range of about 5 times to 15 times.

A resulting reaction solution is then cooled to room temperature, washed, and ODE is further added to disperse reaction products in the reaction solution. The steps from the addition of the shell source mixture (II) to the ODE dispersion are repeated until a predetermined shell thickness is obtained.

Thus, in the step of covering with the shell in the second half, the shell source mixture containing the acidic compound and the zinc halide compound is added (blended) to the shell source mixture (II), which is the shell material.

In order to improve the EQE of the light-emitting element 1, it is necessary to improve the QY of the QDs 25 and further to optimize the particle shape of the QDs 25. As described above, when the QY of the QDs 25 can be increased, the EQE can be improved.

Optimization of the particle shape is described as follows. That is, when a distance between the cores of the QDs is short, Förster resonance energy (FRET) is generated, leading to a decrease in EQE. Therefore, it is considered that the core-shell structure in which the core is surrounded by the shell can physically separate the cores from each other, thereby reducing FRET. However, as a result of intensive studies by the inventors, it has been found that increasing the shell thickness deteriorates the particle shape and accordingly decreases the QY. In addition, known QDs having a core-shell structure have problems in that the surface of the core cannot be entirely covered (i.e., the core cannot be entirely surrounded) with the shell having a predetermined thickness, resulting in defects or local thickening of the shell, which deteriorates the particle shape. Due to these problems, it has not been possible to adequately reduce FRET and effectively reduce EQE.

On the other hand, in the present embodiment, the QY of the QDs 25 can be improved by adding the zinc halide compound to the shell 25*b* little by little. In particular, the QY of the QDs 25 can be effectively improved by adding the zinc halide compound only in the step of covering with the shell in the second half without adding the zinc halide compound in the step of covering with the shell in the first half.

Further, when the shell source mixture is continuously added, the particle shape of the finally obtained QDs 25 deteriorates. However, in the present embodiment, by adding the acidic compound to the shell source mixture, a locally thick portion of the shell 25*b* during formation is etched in the process of forming the shell 25*b*. Thus, the shape of the shell 25*b* to be finally formed is adjusted. As a result, the shape of the QDs 25 is adjusted, and finally the QDs 25 can have an excellent and uniform particle shape with a polygonal cross section.

Hitherto, there is no known method for manufacturing QDs in each of which a core can be entirely covered with a shell having a substantially uniform thickness and that has high QY, at a mass-producible level. However, according to the present embodiment, the QDs 25 in each of which the core 25*a* can be entirely covered with the shell 25*b* having a substantially uniform thickness and has high QY, at a mass-producible level.

In the present embodiment, the zinc halide compound is preferably added in an amount of about 0.5 mol % to 3 mol %, and more preferably in an amount of about 1 mol % to 2 mol % relative to zinc oleate.

Examples of the acidic compound include hydrogen chloride (HCl), hydrogen bromide (HBr), hydrogen iodide (HI), trifluoroacetic acid (TFA), trifluoromethanesulfonic acid (TfOH), acetic acid (AA), sulfuric acid ($H_2SO_4$), and phosphoric acid ($H_3PO_4$). A single type of these acidic compounds may be used alone, or two or more types may be mixed and used, as appropriate.

Among them, as the acidic compound, it is preferable to use at least one selected from the group consisting of hydrogen chloride (HCl), hydrogen bromide (HBr), and trifluoroacetic acid (TFA). Thus, the QDs 25 having high QY can be obtained, and the QDs 25 having an excellent particle shape can be obtained. In the present embodiment, as the acidic compound, for example, a hydrogen chloride-ethyl acetate solution can be added to the shell source mixtures (specifically, the shell source mixture (I) and the shell source mixture (II)).

When the acidic compound is, for example, an organic acid such as trifluoroacetic acid (TFA), a use thereof can be confirmed by, for example, gas chromatography, depending on an amount remaining in the QDs 25.

Examples of the zinc halide compound that can be used include zinc chloride ($ZnCl_2$), zinc bromide ($ZnBr_2$), zinc fluoride ($ZnF_2$), and zinc iodide ($ZnI_2$). A single type of these zinc halide compounds may be used alone, or two or more types may be mixed and used, as appropriate.

Among them, as the zinc halide compound, it is preferable to use at least one of zinc chloride and zinc bromide. In the present embodiment, as the zinc halide compound, for example, a zinc chloride-TOP/OLAc solution can be added to the shell source mixture (II).

In the present embodiment, the S raw material (S source) used for the core-shell structure is not limited, and representative examples thereof include thiols such as octadecanethiol ($C_{18}H_{37}SH$), hexanedecanethiol ($C_{16}H_{33}SH$), tetradecanethiol ($C_{14}H_{29}SH$), dodecanethiol ($C_{12}H_{25}SH$), decanethiol ($C_{10}H_{21}SH$), octanethiol ($C_8H_{17}SH$): a solution of sulfur (S) dissolved in a high-boiling solvent that is long-chain phosphirine hydrocarbon such as trioctylphosphine (e.g., S-TOP): a solution of sulfur (S) dissolved in a high-boiling solvent that is a long-chain hydrocarbon such as octadecene (e.g., S-ODE); and a solution of sulfur (S) dissolved in a mixture of oleylamine and dodecanethiol (S-DDT/OLAm). A single type of these S raw materials may be used alone, or two or more types may be mixed and used, as appropriate.

The reactivity differs depending on the S raw material that is used, and as a result, the covering thickness of the shell 25*b* (e.g., ZnS shell) can be differed. The reactivity of thiol-based S raw materials (thiols) is proportional to the degradation rate thereof, and the reactivity of S-TOP or S-ODE varies in proportion to the stability thereof. Through this, the covering thickness of the shell 25*b* and the final fluorescence quantum efficiency can be controlled by also using a proper S raw material.

Furthermore, in the present embodiment, the less an amine-based solvent in the solvent used during covering with the shell 25*b*, the easier the covering with the shell 25*b* and the better the light-emission characteristics can be obtained. In addition, the light-emission characteristics after covering with the shell 25*b* differ depending on the ratio of the amine-based solvent, the carboxylic acid-based solvent, or the phosphine-based solvent.

Moreover, the QDs 25 synthesized by the above method can be aggregated by adding a polar solvent such as methanol, ethanol, or acetone, and the QDs 25 and the unreacted raw materials can be separated and collected. The collected QDs 25 are again dispersed by adding a solvent such as toluene or hexane again. By adding a solvent that becomes the ligands 21 to the re-dispersed solution, the light-emission characteristics and stability of those light-emission characteristics can be further improved. The change in light-emission characteristics by adding the ligands 21 varies greatly depending on whether the operation of covering with the shell 25*b* is performed. In the present embodiment, the fluorescence stability of the QDs 25, in each of which the core 25*a* is covered with the shell 25*b*, can be particularly improved by adding thiol-based ligands 21.

According to the present embodiment, by using the QDs 25 in the QD layer 15 of the light-emitting element 1, the light-emission characteristics of the light-emitting element 1 can be effectively improved. According to the present embodiment, by using the QDs 25 in the QD layer 15 of the light-emitting element 1, as described above, the light-emitting element 1 having an EQE percentage of 7% or more, preferably 9% or more, more preferably 10% or more, and still more preferably 10.5% or more can be obtained.

Next, the advantageous effects of the QDs 25 and the light-emitting element 1 according to the present embodiment will be described with reference to synthesis examples, examples of QDs 25, and a comparative example. Note that the QDs 25 and the light-emitting element 1 according to the present embodiment are not limited to the following synthesis examples and examples.

In synthesizing blue fluorescent QDs that do not contain Cd, raw materials used in the following synthesis examples, examples, and comparative example are as follows.

Solvent

Octadecene (ODE) available from Idemitsu Kosan Co., Ltd. was used as ODE. "Farmin" available from Kao Corporation was used as Oleylamine (OLAm). "Lunac O-V" available from Kao Corporation was used as oleic acid (OLAc). "Thiokalcol 20" available from Kao Corporation was used as the dodecanethiol (DDT). Trioctylphosphine (TOP) available from Hokko Chemical Industry Co., Ltd. was used as TOP. Ethanol available from DAISHIN CHEMICAL CO., LTD was used as ethanol. Hexane available from Kishida Chemical Co., Ltd. was used as hexane.

Cu Raw Material

Anhydrous copper acetate available from Wako Pure Chemical Industries, Ltd. was used as anhydrous copper acetate.

Zn Raw Material

Anhydrous zinc acetate available from Kishida Chemical Co., Ltd. was used as the anhydrous zinc acetate. A zinc oleate solution (concentration 0.4 M) was prepared by dissolving zinc acetate in a mixed solvent of trioctylphosphine (TOP) and oleic acid (OLAc). A volume ratio of TOP to OLAc in the mixed solvent was 1:1.

Se Raw Material

Se-DDT/OLAm (Se-DDT/OLAm solution) (concentration 0.7 M) was prepared by dissolving selenium (Se) in dodecanethiol (DDT) and oleylamine (OLAm). Se-TOP (Se-TOP solution) (concentration 1 M) was prepared by dissolving selenium (Se) in trioctylphosphine (TOP). Se (4N: 99.99%) available from Shinko Chemical Co., Ltd. was used as selenium (Se).

S Raw Material

S-TOP (S-TOP solution) (concentration 1 M) was prepared by dissolving sulfur (S) in trioctylphosphine (TOP). Sulfur (S) available from Kishida Chemical Co., Ltd. was used as S.

Acidic Compound

A hydrogen chloride-ethyl acetate solution available from KOKUSAN CHEMICAL Co., Ltd. was used as a hydrogen chloride-ethyl acetate solution (concentration 4 M). A hydrogen bromide-acetic acid solution available from Tokyo Chemical Industry Co., Ltd. was used as a hydrogen bromide-acetic acid solution (concentration 5.1 M). Trifluoroacetic acid (TFA) available from FUJIFILM Wako Pure Chemical Corporation was used.

Zinc Halide Compound

Zinc chloride-TOP/OLAc (zinc chloride-TOP/OLAc solution) (concentration 0.8 M) was prepared by dissolving zinc chloride in a mixed solvent of trioctylphosphine (TOP) and oleic acid (OLAc). A volume ratio of TOP:OLAc in the zinc chloride-TOP/OLAc was 1:1. Zinc chloride available from KANTO CHEMICAL CO., INC. was used as zinc chloride. Zinc bromide-TOP/OLAc (zinc bromide-TOP/OLAc solution) (concentration 0.8 M) was prepared by dissolving zinc bromide in a mixed solvent of trioctylphosphine (TOP) and oleic acid (OLAc). A volume ratio of TOP:OLAc in zinc bromide-TOP/OLAc was 1:1. Zinc bromide available from Kishida Chemical Co., Ltd. was used as zinc bromide.

In addition, measuring instruments used for evaluating obtained QDs and light-emitting elements in the following synthesis examples, examples, and comparative example are as follows.

Measuring Instrument

"F-2700" available from JASCO Corporation was used as a fluorescence spectrometer. "V-770" available from Hitachi, Ltd. was used as an ultraviolet-visible-near-infrared spectrophotometer. "QE-1100" available from Otsuka Electronics Co., Ltd. was used as a fluorescence quantum efficiency measuring device. "D2 PHASER" available from Bruker Corporation was used as an X-ray diffraction (XRD) device. "SU9000" available from Hitachi, Ltd. was used as a scanning electron microscope (SEM). "C11367" available from Hamamatsu Photonics K.K. was used as a fluorescence lifetime measuring device. A light-emitting diode (LED) measuring device available from Spectra Co-op (two-dimensional CCD small high sensitivity spectrometer: "Solid Lambda CCD" available from Carl Zeiss AG) was used as an LED measuring device. "JEM-ARM200CF" available from JEOL Ltd. was used as a transmission electron microscope (TEM). "JED 2300T" available from JEOL Ltd. was used as an energy dispersive X-ray (EDX) analyzer.

First, synthesis examples of the QDs 25 according to the present embodiment will be described.

Synthesis Example 1 of QDs 25

Method for Synthesizing ZnSe Core

A 300 mL reaction vessel was charged with 728 mg of anhydrous copper acetate $Cu(OAc)_2$), 19.2 mL of oleylamine (OLAm), and 31 mL of octadecene (ODE). In an inert gas ($N_2$) atmosphere, the raw materials in the reaction vessel were then dissolved by heating at 165° C. for 20 minutes while stirring to obtain a solution (A1).

To the solution (A1), 4.56 mL of the Se-DDT/OLAm solution (concentration 0.7 M) was added and a resulting mixture was heated at 165° C. for 30 minutes while stirring. A resulting reaction solution (CuSe reaction solution (A2)) was cooled to room temperature.

Thereafter, to the CuSe reaction solution (A2), 7376 mg of anhydrous zinc acetate ($Zn(OAc)_2$), 40 mL of trioctylphosphine (TOP), and 1.6 mL of oleylamine (OLAm) were added, and a resulting mixture was heated at 200° C.

for 1 hour in an inert gas ($N_2$) atmosphere while stirring. A resulting reaction solution (ZnSe reaction solution (A3)) was cooled to room temperature.

Subsequently, ethanol was added to the ZnSe reaction solution (A3) to generate a precipitate, and the solution was centrifuged to collect the precipitate. A ZnSe-ODE dispersion (A4) was obtained by adding 96 mL of octadecene (ODE) to the collected precipitate to disperse the precipitate.

Thereafter, 7376 mg of anhydrous zinc acetate ($Zn(OAc)_2$), 40 mL of trioctylphosphine (TOP), 4 mL of oleylamine (OLAm), and 24 mL of oleic acid (OLAc) were added to 96 mL of the ZnSe-ODE solution (A4), and a resulting mixture was heated at 290° C. for 30 minutes in an inert gas ($N_2$) atmosphere while stirring. A resulting reaction solution (ZnSe reaction solution (A5)) was cooled to room temperature.

Subsequently, the ZnSe reaction solution (A5) was measured with the fluorescence spectrometer. The measurement results indicated optical characteristics including a fluorescence wavelength of approximately 446.5 nm and a fluorescence full-width at half-maximum of approximately 14 nm.

Method for Covering ZnSe Core with Shell

Ethanol was added to 40 mL of the ZnSe reaction solution (A5) to generate a precipitate, and the solution was centrifuged to collect the precipitate. A ZnSe-ODE dispersion (A6) was obtained by adding 35 mL of octadecene (ODE) to the collected precipitate to disperse the precipitate.

2 mL of oleic acid (OLAc) and 4 mL of trioctylphosphine (TOP) were added to 35 mL of the ZnSe-ODE dispersion (A6), and a resulting mixture was heated at 320° C. for 10 minutes in an inert gas ($N_2$) atmosphere while stirring.

To a resulting reaction solution (A7), 0.9 mL of a mixture of 0.5 mL of the Se-TOP (concentration 1 M), 0.5 mL of the S-TOP solution (concentration 1 M), and 5 mL of the zinc oleate ($Zn(OLAc)_2$) solution (concentration 0.4 M) was added and a resulting mixture was heated at 320° C. for 10 minutes while stirring. This operation was repeated four times. Thus, a reaction solution (A8) containing ZnSe/ZnSeS in which a ZnSe core was covered with a ZnSeS shell was obtained.

Ethanol was then added to the resulting reaction solution (A8) to generate a precipitate, and the solution was centrifuged to collect the precipitate. A dispersion (A9) was obtained by adding 35 mL of octadecene (ODE) to the collected precipitate to disperse the precipitate. Subsequently, 2 mL of oleic acid (OLAc) and 4 mL of trioctylphosphine (TOP) were added to the dispersion (A9), and a resulting mixture was heated at 320° C. for 10 minutes in an inert gas ($N_2$) atmosphere while stirring.

To a resulting reaction solution (A10), 0.9 mL of a mixture of 0.4 mL of DDT, 1.6 mL of trioctylphosphine (TOP), 0.12 mL of hydrogen chloride-ethyl acetate solution (concentration 4 M), and 10 mL of the zinc oleate ($Zn(OLAc)_2$) solution (concentration 0.4 M) was added as a shell source mixture (I) and a resulting mixture was heated at 320° C. for 10 minutes while stirring. This operation was repeated ten times.

Ethanol was then added to a resulting reaction solution (A11) to generate a precipitate, and the solution was centrifuged to collect the precipitate. A dispersion (A12) was obtained by adding 35 mL of octadecene (ODE) to the collected precipitate (ZnSe/ZnSeS/ZnS) to disperse the precipitate. Subsequently, 2 mL of oleic acid (OLAc) and 4 mL of trioctylphosphine (TOP) were added to the dispersion (A12), and a resulting mixture was heated at 320° C. for 10 minutes in an inert gas ($N_2$) atmosphere while stirring.

Subsequently, to a resulting reaction solution (A13), 0.9 mL of a mixture of 0.4 mL of DDT, 1.6 mL of trioctylphosphine (TOP), 0.12 mL of the hydrogen chloride-ethyl acetate solution (concentration 4 M), 0.1 mL of the zinc chloride-TOP/OLAc solution (concentration 0.8 M), and 10 mL of the zinc oleate ($Zn(OLAc)_2$) solution (concentration 0.4 M) was added as a shell source mixture (II) and a resulting mixture was heated at 320° C. for 10 minutes while stirring. This operation was repeated ten times.

Ethanol was then added to the resulting reaction solution (A13) to generate a precipitate, and the solution was centrifuged to collect the precipitate. A dispersion (A14) was obtained by adding 35 mL of octadecene (ODE) to the collected precipitate to disperse the precipitate. Subsequently, 2 mL of oleic acid (OLAc) and 4 mL of trioctylphosphine (TOP) were added to the dispersion (A14), and a resulting mixture was heated at 320° C. for 10 minutes in an inert gas ($N_2$) atmosphere while stirring.

Subsequently, to a resulting reaction solution (A15), 0.9 mL of a mixture of 0.4 mL of DDT, 1.6 mL of trioctylphosphine (TOP), 0.2 mL of the hydrogen chloride-ethyl acetate solution (concentration 4 M), 0.1 mL of zinc chloride-TOP/OLAc solution (concentration 0.8 M), and 10 mL of zinc oleate ($Zn(OLAc)_2$) solution (concentration 0.4 M) was added and a resulting mixture was heated at 320° C. for 10 minutes while stirring. This operation was repeated ten times. Thus, a reaction solution (A16) containing the QDs 25 (ZnSe/ZnSeS/ZnS) according to Synthesis Example 1 as reaction products was obtained.

Figure 6:
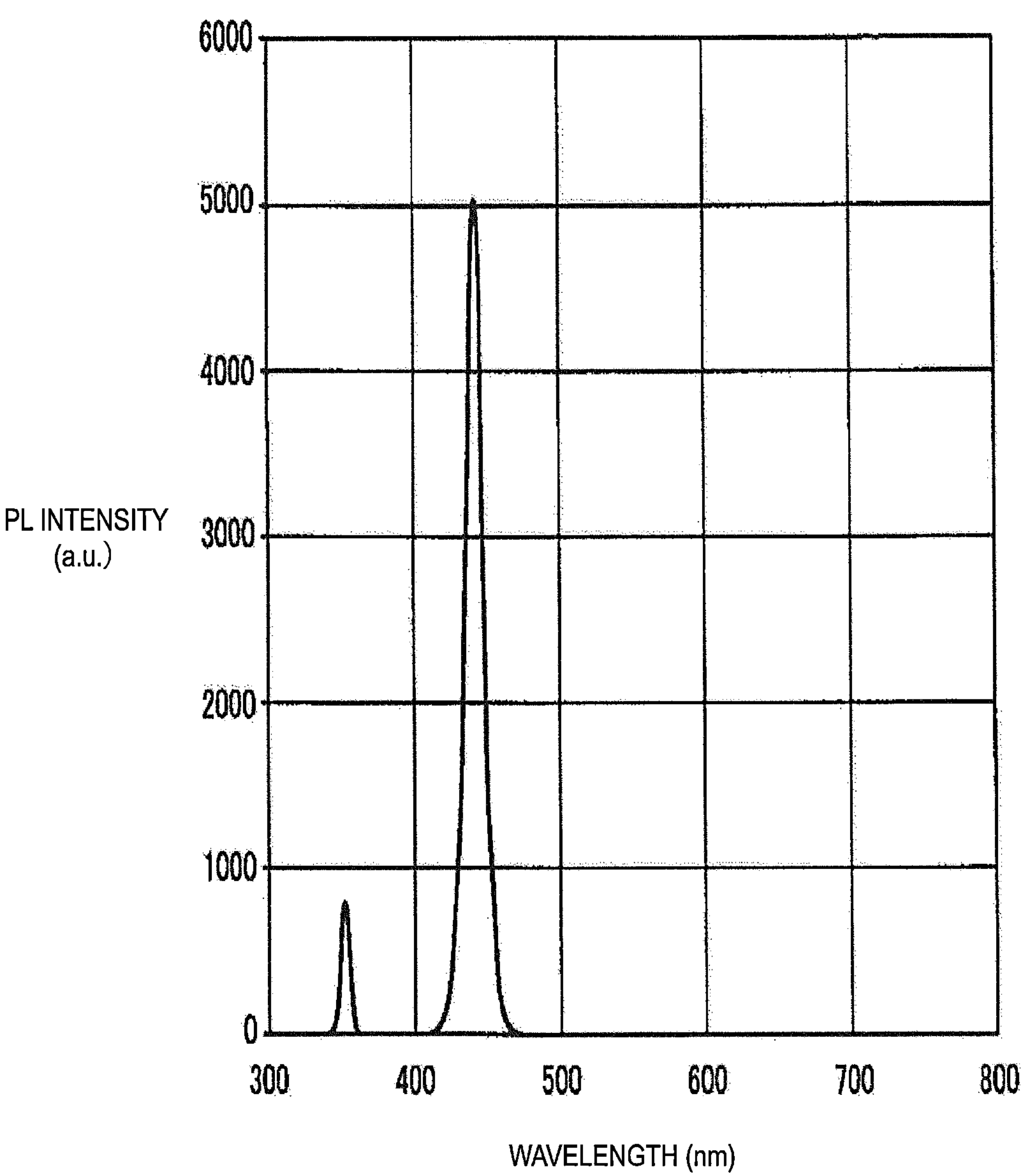
FIG. 6 is a graph showing a fluorescence spectrum of quantum dots obtained in Synthesis Example 1.

Subsequently, a fluorescence wavelength and a fluorescence full-width at half-maximum of the QDs 25 in the resulting reaction solution (A16) were measured with the fluorescence spectrometer. As shown in FIG. 6, the measurement results indicated optical characteristics including a fluorescence wavelength of 441.5 nm (approximately 442 nm) and a fluorescence full-width at half-maximum of 15.0 nm (approximately 15 nm).

Subsequently, ethanol was added to the reaction solution (A16) to generate a precipitate, and the solution was centrifuged to collect QDs 25 according to the present embodiment as the precipitate. Subsequently, hexane was added to the collected precipitate and dispersed to obtain a QD dispersion (A17) containing QDs 25 according to the present embodiment.

Figure 7:
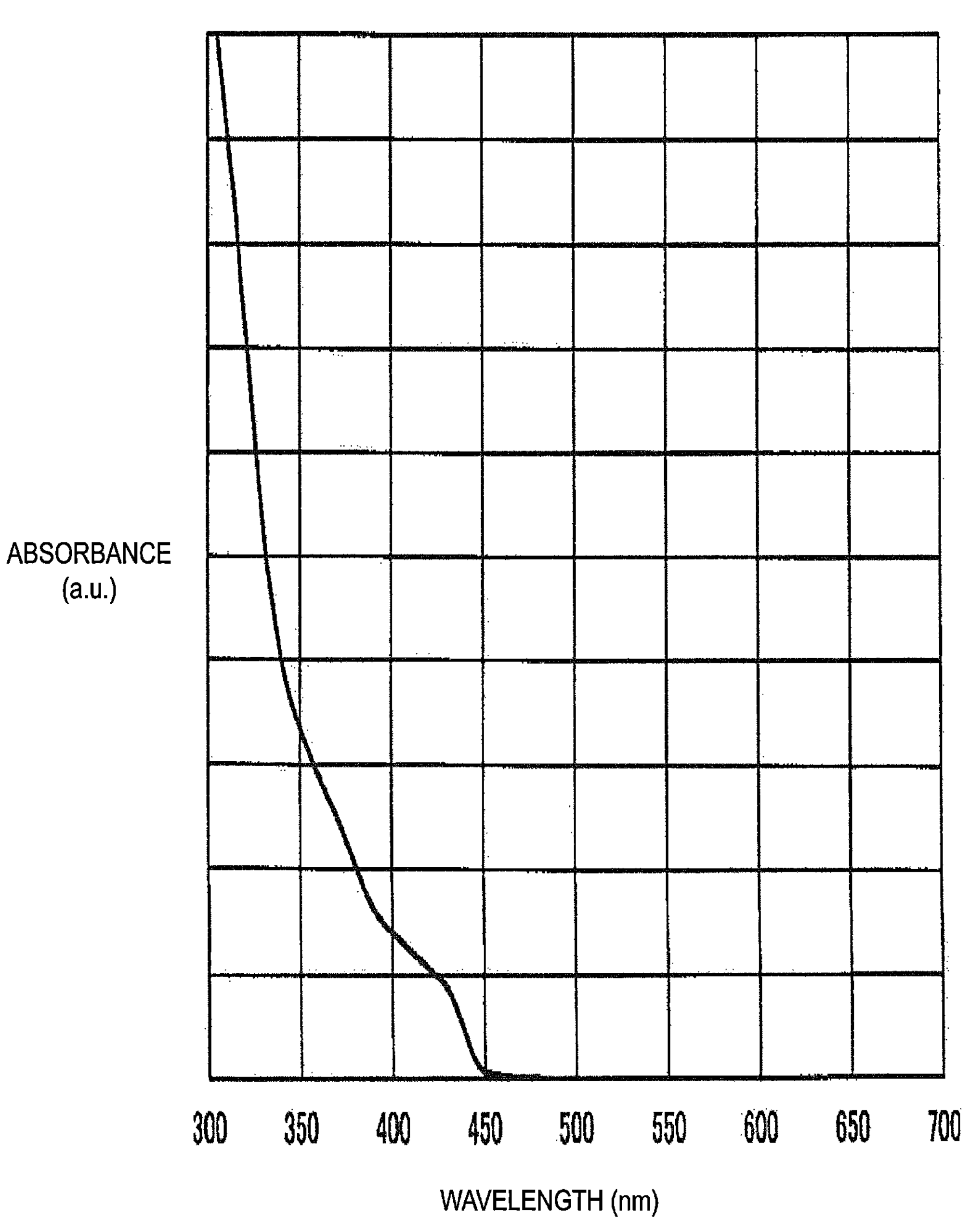
FIG. 7 is a graph showing an ultraviolet-visible absorption spectrum of the quantum dots obtained in Synthesis Example 1.
Figure 8:
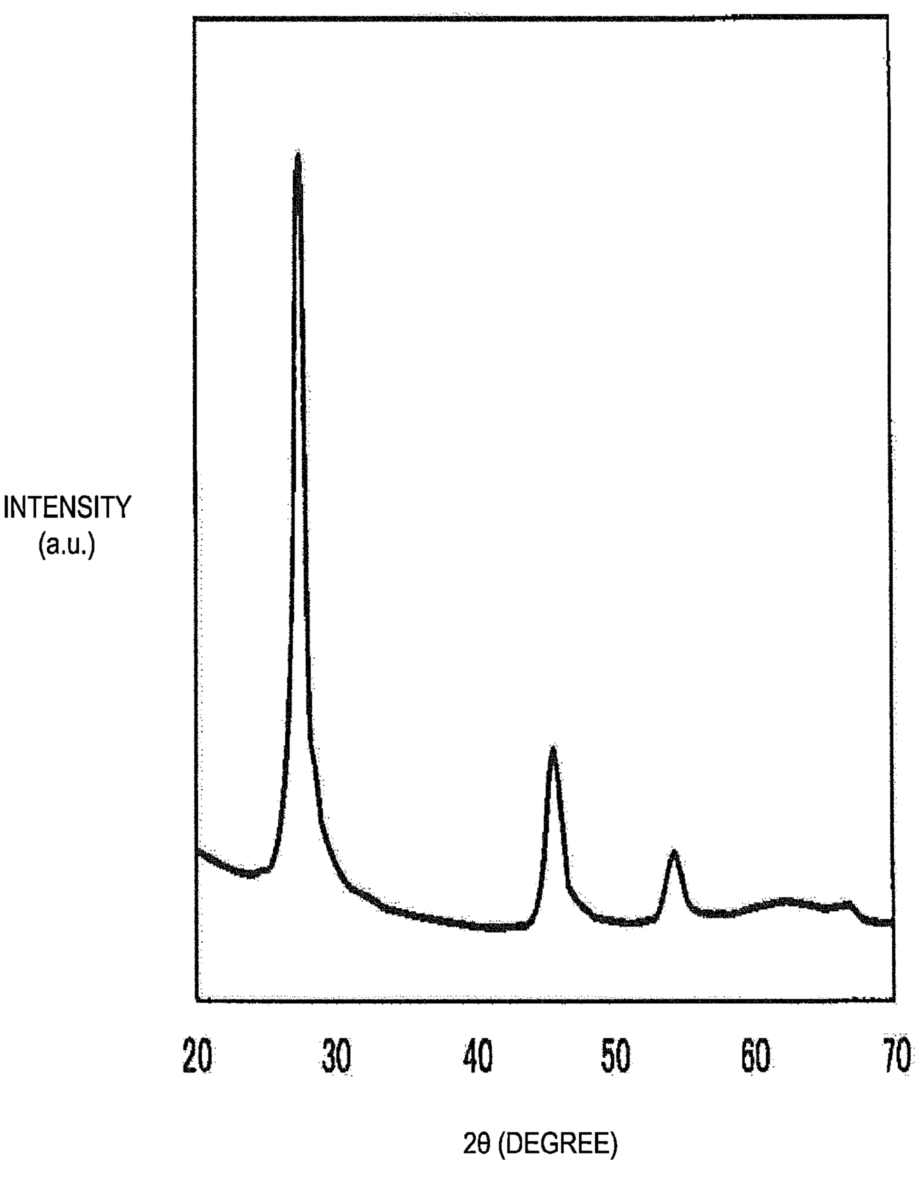
FIG. 8 is a graph showing an X-ray diffraction spectrum of the quantum dots obtained in Synthesis Example 1.

An ultraviolet-visible absorption spectrum of the QDs 25 in the obtained QD dispersion (A17) was measured with the ultraviolet-visible-near-infrared spectrophotometer. As a result, the ultraviolet-visible absorption spectrum shown in FIG. 7 was obtained. In addition, X-ray diffraction measurement of the QDs 25 in the QD dispersion (A17) was performed using the XRD device. FIG. 8 is a graph showing an X-ray diffraction (XRD) spectrum of the QDs 25 obtained in Synthesis Example 1. From the XRD spectrum shown in FIG. 8, cubic crystal peaks composed of Zn, Se, and S were confirmed.

Further, the QDs 25 in the dispersion (A17) were imaged by the SEM. From this SEM image, it was found that the particle shapes of the QDs 25 were substantially rectangular (substantially cubic) and were excellent.

Measurement Result

The fluorescence quantum efficiency (QY) of the QDs 25 (ZnSe/ZnSeS/ZnS) in the QD dispersion (A17) was measured with the quantum efficiency measurement system. The measurement results showed that a QY percentage was approximately 96%. The fluorescence lifetime of the QDs 25 in the QD dispersion (A17) was measured with the fluorescence lifetime measuring device and was 16 ns. Elemental analysis (EDX) of the QDs 25 obtained in Synthesis Example 1 using the EDX analyzer showed that Zn: 42 atom %, Se: 11 atom %, S: 41 atom %, and Cl: 1 atom %. Zn on the shell surface is considered to locally form $ZnCl_2$.

The QDs 25 obtained in Synthesis Example 1 were analyzed using the TEM and the EDX analyzer (TEM-EDX analysis). The shell thickness of the QDs 25 can be estimated from the TEM-EDX analysis image. As a result, the shell thickness of the QDs 25 obtained in Synthesis Example 1 was 2.0 nm.

Synthesis Example 2

The QDs 25 were synthesized under the same conditions as in Synthesis Example 1, except that the zinc chloride-TOP/OLAc solution (concentration 0.8 M) in Synthesis Example 1 was changed to the zinc bromide-TOP/OLAc solution (concentration 0.8 M). In other words, QDs 25 (ZnSe/ZnSeS/ZnS) were synthesized under the same conditions as in Synthesis Example 1 except that the zinc halide compound was changed from zinc chloride ($ZnCl_2$) to zinc bromide ($ZnBr_2$).

A fluorescence wavelength, fluorescence full-width at half-maximum, QY, and shell thickness of the QDs 25 were measured in the same manner as in Synthesis Example 1. As a result, the QDs 25 obtained in Synthesis Example 2 had a fluorescence wavelength of 442.5 nm (approximately 443 nm), a fluorescence full-width at half-maximum of 15.1 nm (approximately 15 nm), a QY percentage of approximately 98%, and a shell thickness of 2.2 nm. A SEM image of the QDs 25 was captured by performing the same operation as in Synthesis Example 1. Particle shapes of the QDs 25 were also substantially rectangular (substantially cubic) similarly to the QDs 25 obtained in Synthesis Example 1 and excellent.

Synthesis Example 3

The QDs 25 were synthesized under the same conditions as in Synthesis Example 2, except that the hydrogen chloride-ethyl acetate solution (concentration 4 M) (see Synthesis Example 1) was changed to the hydrogen bromide-acetic acid solution (concentration 4 M). In other words, QDs 25 (ZnSe/ZnSeS/ZnS) were synthesized under the same conditions as in Synthesis Example 2, except that the acidic compound was changed from hydrogen chloride (HCl) to hydrogen bromide (HBr).

A fluorescence wavelength, fluorescence full-width at half-maximum, QY, and shell thickness of the QDs 25 were measured in the same manner as in Synthesis Example 1. As a result, the QDs 25 obtained in Synthesis Example 3 had a fluorescence wavelength of 440.5 nm (approximately 441 nm), a fluorescence full-width at half-maximum of 14.4 nm (approximately 14 nm), a QY percentage of approximately 70%, and a shell thickness of 2.0 nm. A SEM image of the QDs 25 was captured by performing the same operation as in Synthesis Example 1. Particle shapes of the QDs 25 were also substantially rectangular (substantially cubic) similarly to the QDs 25 obtained in Synthesis Example 1 and excellent.

Synthesis Example 4

The QDs 25 were synthesized under the same conditions as in Synthesis Example 1, except that the hydrogen chloride-ethyl acetate solution (concentration 4 M) was changed to trifluoroacetic acid (TFA). In other words, QDs 25 (ZnSe/ZnSeS/ZnS) were synthesized under the same conditions as in Synthesis Example 1, except that TFA was used as the acidic compound.

A fluorescence wavelength, fluorescence full-width at half-maximum, QY, and shell thickness of the QDs 25 were measured in the same manner as in Synthesis Example 1. As a result, the QDs 25 obtained in Synthesis Example 4 had a fluorescence wavelength of 441.5 nm (approximately 442 nm), a fluorescence full-width at half-maximum of 14.0 nm (approximately 14 nm), a QY percentage of approximately 78%, and a shell thickness of 2.5 nm. A SEM image of the QDs 25 was captured by performing the same operation as in Synthesis Example 1. Particle shapes of the QDs 25 were also substantially rectangular (substantially cubic) similarly to the QDs 25 obtained in Synthesis Example 1 and excellent.

Synthesis Example 5

The QDs 25 were synthesized under the same conditions as in Synthesis Example 2, except that the hydrogen chloride-ethyl acetate solution (concentration 4 M) used in Synthesis Example 2 (see Synthesis Example 1) was changed to trifluoroacetic acid (TFA). In other words, QDs 25 (ZnSe/ZnSeS/ZnS) were synthesized under the same conditions as in Synthesis Example 2, except that TFA was used as the acidic compound.

A fluorescence wavelength, fluorescence full-width at half-maximum, QY, and shell thickness of the QDs 25 were measured in the same manner as in Synthesis Example 1. As a result, the QDs 25 obtained in Synthesis Example 5 had a fluorescence wavelength of 442.0 nm (approximately 442 nm), a fluorescence full-width at half-maximum of 14.7 nm (approximately 15 nm), a QY percentage of approximately 76%, and a shell thickness of 2.0 nm. A SEM image of the QDs 25 was captured by performing the same operation as in Synthesis Example 1. Particle shapes of the QDs 25 were also substantially rectangular (substantially cubic) similarly to the QDs 25 obtained in Synthesis Example 1 and excellent.

As described above, in Synthesis Examples 1 to 5, the QDs 25 having a QY percentage of 70% or more were obtained. In particular, in Synthesis Example 2, the QY percentage was able to be improved to 98%.

Further, in all synthesis examples, the fluorescence full-width at half-maximum was able to be made 20 nm or less. Furthermore, in all synthesis examples, blue fluorescence was exhibited because the fluorescence wavelength was able to fall within a range of 410 nm to 470 nm.

In all synthesis examples, the shell thickness was in a range of approximately 2 nm to 2.5 nm.

The measurement results are shown in FIG. 9 together with the types of acidic compound and zinc halide compound used in Synthesis Examples 1 to 5, the SEM images of the respective QDs 25 obtained in Synthesis Examples 1 to 5, and the EQE percentages of the respective light-emitting elements 1 obtained in the examples described later using the respective QDs 25 obtained in Synthesis Examples 1 to 5. In FIG. 9, "half width" indicates the "fluorescence full-width at half-maximum" described above.

As can be seen from the SEM images obtained in the respective synthesis examples shown in FIG. 9, the particle shapes of the QDs 25 obtained in the synthesis examples were substantially rectangular (substantially cubic) as described above, and were excellent. That is, in any of the synthesis examples, it is considered that the ZnSe core was crystallized in a substantially rectangular shape, and was entirely covered with the shell having a predetermined thickness, thereby maintaining the substantially rectangular particle shape. This is presumably because the addition of the acidic compound to the shell source mixture had an effect of etching a portion where the particle shape was deteriorated.

Example 1

Using the QD dispersion (A17) containing the QDs 25 synthesized in Synthesis Example 1, which was finally obtained in Synthesis Example 1, the light-emitting element 1 having the following layered structure was manufactured.

ITO (30 nm)/PEDOT:PSS (40 nm)/PVK (20 nm)/QD layer (20 nm)/LiZnO (50 nm)/A1 (65 nm)

Specifically, first, the anode electrode 12 having a thickness of 30 nm was formed by sputtering ITO on the substrate 11, which was a glass substrate. Subsequently, an aqueous solution containing PEDOT:PSS was applied onto the anode electrode 12 by spin coating, and then a solvent was volatilized by baking. Thus, the HIL 13 (PEDOT:PSS layer) having a layer thickness of 40 nm was formed. Subsequently, a solution of PVK dissolved in chlorobenzene was applied onto the HIL 13 by spin coating, and then a solvent was volatilized by baking. Thus, in each sample, the HTL 14 (PVK layer) having a layer thickness of 20 nm was formed. Subsequently, the QD dispersion (A17) was applied onto the HTL 14 by spin coating with the concentration adjusted to 7.5 mg/mL, and then a solvent was volatilized by baking. Thus, the QD layer 15 having a layer thickness of 20 nm was formed. Subsequently, a dispersion in which LiZnO nanoparticles were dispersed in ethanol was applied onto the QD layer 15 by spin coating, and then a solvent was volatilized by baking. Thus, the ETL 16 (LiZnO nanoparticle layer) having a layer thickness of 50 nm was formed. Subsequently, the cathode electrode 17 having a thickness of 65 nm was formed on the ETL 16 by vacuum vapor deposition of A1. Next, the substrate 11 and the layered body formed on the substrate 11 in each sample were sealed with a sealing member in an $N_2$ atmosphere.

Subsequently, a current with a current density of 0 to 75 $mA/cm^2$ was applied to the light-emitting element 1. A luminance value of LB emitted from the light-emitting element 1 by this applied current was then measured using the LED measuring device.

Thereafter, an external quantum efficiency (EQE) percentage of the light-emitting element 1 was calculated based on the measured luminance value. Note that currents with multiple current values selected from the above-described range were applied to the light-emitting element 1. Thus, multiple luminance values were measured for the light-emitting element 1. Among the multiple EQE percentages calculated based on these multiple luminance values, the EQE indicating the highest numerical value was used as the EQE of the light-emitting element 1.

As a result, the maximum EQE percentage of the light-emitting element 1 using the QDs 25 obtained in Synthesis Example 1 as the QD layer 15 was 18.6%. The result is shown in FIG. 9 together with the other measurement results in Synthesis Example 1, as described above.

Example 2

The light-emitting element 1 was manufactured under the same conditions as in Example 1, except that instead of the QD dispersion (A17) in Example 1, the QD dispersion containing the QDs 25 synthesized in Synthesis Example 2, which was finally obtained in Synthesis Example 2, was used. The EQE of the light-emitting element 1 was measured in the same manner as in Example 1.

As a result, the maximum EQE percentage of the light-emitting element 1 using the QDs 25 obtained in Synthesis Example 2 as the QD layer 15 was 13.0%. The result is shown in FIG. 9 together with the other measurement results in Synthesis Example 2, as described above.

Example 3

The light-emitting element 1 was manufactured under the same conditions as in Example 1, except that instead of the QD dispersion (A17) in Example 1, the QD dispersion containing the QDs 25 synthesized in Synthesis Example 4, which was finally obtained in Synthesis Example 4, was used. The EQE of the light-emitting element 1 was measured in the same manner as in Example 1.

As a result, the maximum EQE percentage of the light-emitting element 1 using the QDs 25 obtained in Synthesis Example 4 as the QD layer 15 was 9.7%. The result is shown in FIG. 9 together with the other measurement results in Synthesis Example 4, as described above.

Example 4

The light-emitting element 1 was manufactured under the same conditions as in Example 1, except that instead of the QD dispersion (A17) in Example 1, the QD dispersion containing the QDs 25 synthesized in Synthesis Example 5, which was finally obtained in Synthesis Example 5, was used. The EQE of the light-emitting element 1 was measured in the same manner as in Example 1.

As a result, the maximum EQE percentage of the light-emitting element 1 using the QDs 25 obtained in Synthesis Example 5 as the QD layer 15 was 10.9%. The result is shown in FIG. 9 together with the other measurement results in Synthesis Example 5 as described above.

As described above, in Examples 1 to 4, the light-emitting element 1 having an EQE percentage of 7% or more was obtained. In particular, in Example 1, the EQE percentage was improved to 18.6%.

Comparative Example 1

In Comparative Example 1, a core was covered with a shell without mixing acidic compound and zinc halide compound with a shell source mixture. Specifically, the core was covered with the shell by the following steps.

A 100 mL reaction vessel was charged with 182 mg of anhydrous copper acetate ($Cu(OAc)_2$), 4.8 mL of oleylamine (OLAm), and 7.75 mL of octadecene (ODE). In an inert gas ($N_2$) atmosphere, the raw materials in the reaction vessel were then heated at 165° C. for 5 minutes while stirring to dissolve the raw materials to obtain a solution (a1).

To the solution (a1), 1.14 mL of the Se-DDT/OLAm solution (concentration 0.7 M) was added and a resulting mixture was heated at 165° C. for 30 minutes while stirring. A resulting reaction solution (CuSe reaction solution (a2)) was cooled to room temperature.

Thereafter, to the CuzSe reaction solution (a2), 1844 mg of anhydrous zinc acetate ($Zn(OAc)_2$), 10 mL of trioctylphosphine (TOP), and 0.4 mL of oleylamine (OLAm) were added, and a resulting mixture was heated at 180° C. for 45 minutes in an inert gas ($N_2$) atmosphere while stirring. A resulting reaction solution (ZnSe reaction solution (a3)) was cooled to room temperature.

Subsequently, ethanol was added to the ZnSe reaction solution (a3) to generate a precipitate, and the solution was centrifuged to collect the precipitate. A ZnSe-ODE dispersion (a4) was obtained by adding 12 mL of octadecene (ODE) to the collected precipitate to disperse the precipitate.

Thereafter, 1844 mg of anhydrous zinc acetate ($Zn(OAc)_2$), 10 mL of trioctylphosphine (TOP), 1 mL of oleylamine (OLAm), and 6 mL of oleic acid (OLAc) were added to 12 mL of the ZnSe-ODE solution (a4), and a resulting mixture was heated at 280° C. for 20 minutes in an inert gas ($N_2$) atmosphere while stirring. A resulting reaction solution (ZnSe reaction solution (a5)) was cooled to room temperature.

Subsequently, the ZnSe reaction solution (a5) was measured with the fluorescence spectrometer. The measurement results indicated optical characteristics including a fluorescence wavelength of approximately 447.5 nm and a fluorescence full-width at half-maximum of approximately 14 nm.

Ethanol was added to 20 mL of the ZnSe reaction solution (a5) to generate a precipitate, and the solution was centrifuged to collect the precipitate. A ZnSe-ODE dispersion (a6) was obtained by adding 17.5 mL of octadecene (ODE) to the collected precipitate to disperse the precipitate.

1 mL of oleic acid (OLAc) and 2 mL of trioctylphosphine (TOP) were added to 17.5 mL of the ZnSe-ODE dispersion (a6), and a resulting mixture was heated at 320° C. for 10 minutes in an inert gas ($N_2$) atmosphere while stirring.

To a resulting reaction solution (a7), 0.5 mL of a mixture of 0.5 mL of the Se-TOP solution (concentration 1 M), 0.125 mL of DDT, 0.375 mL of trioctylphosphine (TOP), and 5 mL of the zinc oleate ($Zn(OLAc)_2$) solution (concentration 0.4 M) was added and a resulting mixture was heated at 320° C. for 10 minutes while stirring. This operation was repeated four times. Thus, a reaction solution (a8) containing ZnSe/ZnSeS in which a ZnSe core was covered with a ZnSeS shell was obtained.

Ethanol was then added to the resulting reaction solution (a8) to generate a precipitate, and the solution was centrifuged to collect the precipitate. A dispersion (a9) was obtained by adding 17.5 mL of octadecene (ODE) to the collected precipitate to disperse the precipitate. Subsequently, 1 mL of oleic acid (OLAc) and 2 mL of trioctylphosphine (TOP) were added to the dispersion (a9), and a resulting mixture was heated at 320° C. for 10 minutes in an inert gas ($N_2$) atmosphere while stirring.

To a resulting reaction solution (a10), 0.5 mL of a mixture of 0.5 mL of DDT, 1.5 mL of trioctylphosphine (TOP), and 10 mL of the zinc oleate ($Zn(OLAc)_2$) solution (concentration 0.4 M) was added, and a resulting mixture was heated at 320° C. for 10 minutes while stirring. This operation was repeated ten times.

Ethanol was then added to a resulting reaction solution (a11) to generate a precipitate, and the solution was centrifuged to collect the precipitate. This collected precipitate (ZnSe/ZnSeS/ZnS) was dispersed by adding 17.5 mL of octadecene (ODE) (washing step).

Subsequently, 1 mL of oleic acid (OLAc) and 2 mL of trioctylphosphine (TOP) were added to a dispersion (a12) obtained through the washing step, and a resulting mixture was heated at 320° C. for 10 minutes in an inert gas ($N_2$) atmosphere while stirring.

Subsequently, to a resulting reaction solution (a13), 0.5 mL of a mixture of 0.5 mL of DDT, 1.5 mL of trioctylphosphine (TOP), and 10 mL of the zinc oleate ($Zn(OLAc)_2$) solution (concentration 0.4 M) was added, and a resulting mixture was heated at 320° C. for 10 minutes while stirring. This operation was repeated six times. Thereafter, the mixture was heated at 320° C. for 30 minutes while stirring (step of covering with the shell).

Thereafter, the washing step and the step of covering with the shell were repeated three times. Thus, a reaction solution (a14) containing QDs (ZnSe/ZnSeS/ZnS) for comparison according to Comparative Example 1 as reaction products was obtained. Subsequently, the reaction solution (a14) was cooled to room temperature.

A fluorescence wavelength and a fluorescence full-width at half-maximum of the QDs for comparison in the obtained reaction solution (a14) were measured by the fluorescence spectrometer. The measurement results indicated optical characteristics including a fluorescence wavelength of 443.0 (approximately 443 nm) and a fluorescence full-width at half-maximum of 15.0 (approximately 15 nm).

Subsequently, ethanol was added to the reaction solution (a14) to generate a precipitate, and the solution was centrifuged to collect the QDs for comparison as the precipitate. Subsequently, hexane was added to the collected precipitate and dispersed to obtain a QD dispersion (a15) containing the QDs for comparison.

Subsequently, fluorescence quantum efficiency (QY) of the QDs (ZnSe/ZnSeS/ZnS) for comparison in the QD dispersion (a15) was measured with the quantum efficiency measurement system. The measurement results showed that the QY percentage was approximately 60%. A fluorescence lifetime of the QDs for comparison in the QD dispersion (a15) was measured with the fluorescence lifetime measuring device, and was found to be 14 ns.

Subsequently, using the QD dispersion (a15) containing the QDs for comparison finally obtained in Comparative Example 1, a manufacturing operation was performed according to the manufacturing operation in Example 1 to manufacture a light-emitting element for comparison having the following layered structure.

ITO (30 nm)/PEDOT:PSS (40 nm)/PVK (20 nm)/QD layer (20 nm)/ZnO (50 nm)/A1 (65 nm)

Subsequently, EQE of the light-emitting element was measured using the same method as in Example 1.

As a result, the maximum EQE percentage of the light-emitting element for comparison using the QDs obtained in this comparative example as the QD layer 15 was 4.0%. This result is shown in Table 1 together with the fluorescence wavelength, half width (fluorescence full-width at half-maximum), QY, fluorescence lifetime (1/e), shell thickness for the QDs for comparison and for the QDs 25 used in Example 1, and the EQE percentage of the light-emitting element 1 manufactured in Example 1.

TABLE 1

| | Example 1 | Comparative example 1 |
|---|---|---|
| Fluorescence wavelength (nm) | 441.5 | 443.0 |
| Fluorescence full-width at half-maximum (nm) | 15.0 | 15.0 |
| QY (%) | 96 | 60 |
| Fluorescence lifetime (1/e) (ns) | 16 | 14 |
| Shell thickness (nm) | 2.0 | 2.0 |
| EQE (%) | 18.6 | 4.0 |

As shown in Table 1, the light-emitting element for comparison manufactured in Comparative Example 1 was found to have lower EQE than the light-emitting element 1 manufactured in Example 1.

Figure 10:
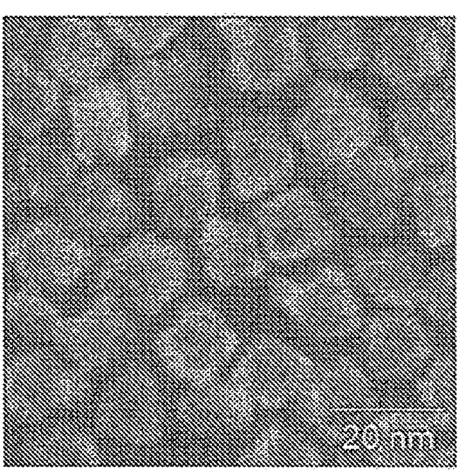
FIG. 10 is a diagram showing a TEM-EDX analysis image in Comparative Example 1.
Figure 11:
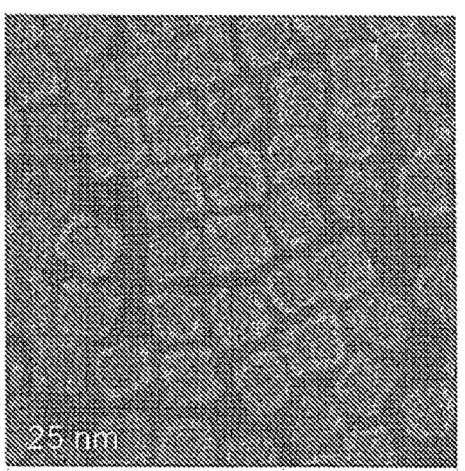
FIG. 11 is a diagram showing a TEM-EDX analysis image in Example 1.
Figure 12:
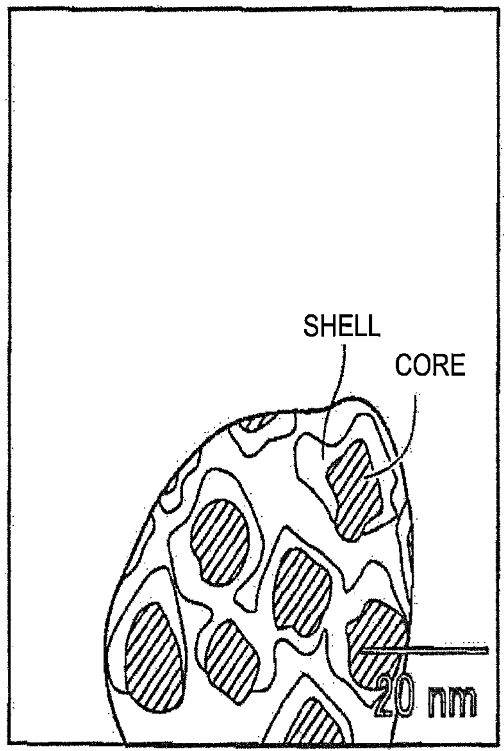
FIG. 12 is a partial schematic view of FIG. 10.

FIG. 10 is a diagram showing a TEM-EDX analysis image in Comparative Example 1, and FIG. 11 is a diagram showing a TEM-EDX analysis image in Example 1. FIG. 12 is a partial schematic view of FIG. 10, and FIG. 13 is a partial schematic view of FIG. 11.

The TEM-EDX analysis images shown in FIGS. 10 and 11 are shown in three colors (red, blue, and green), and it was found that a central area was substantially purple with mainly red and blue mixed together, while an outer area is substantially yellow with mainly red and green mixed together. Since red represents Zn, blue represents Se, and green represents S, it was found that Zn and Se mainly existed in the central area and Zn and S mainly existed in the outer area. Therefore, from the TEM-EDX analysis images shown in FIGS. 10 and 11, it can be presumed that the core is a ZnSe core containing Zn and Se, and a ZnS shell containing Zn and S is contained outside the core. Note that the shell thickness can be estimated by measuring the thickness of the substantially yellow area from the TEM-EDX analysis image.

From FIGS. 10 and 12, the QDs for comparison obtained in Comparative Example 1 showed that the thickness of the shell around the core was not constant, and there were some portions in which the shell was discontinuous or grew locally. Therefore, it is considered that the particle shapes of the QDs for comparison obtained in Comparative Example 1 were deteriorated, so that Förster resonance energy transfer (FRET) was likely to occur, resulting in a decrease in EQE. In Comparative Example 1, the QY was not as high as in Example 1.

Figure 13:
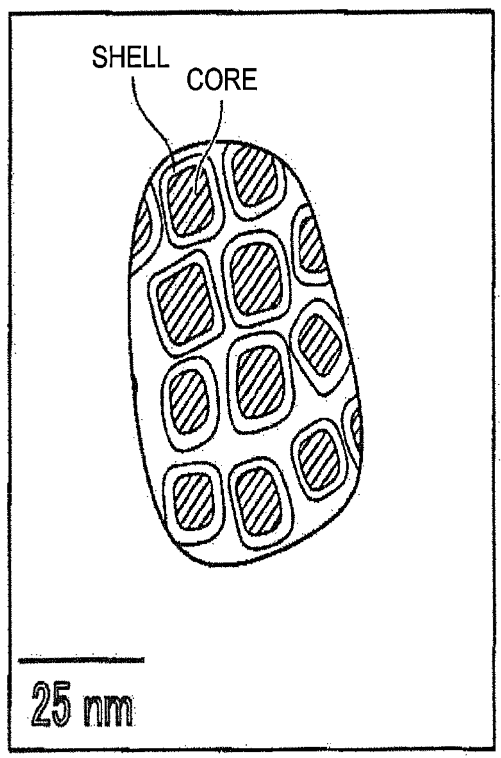
FIG. 13 is a partial schematic view of FIG. 11.

On the other hand, in the QDs 25 used in Example 1, as shown in FIGS. 11 and 13, the core **25*a* is neatly covered in its entirety with the shell 25*b*, the shell 25*b* had a substantially constant thickness, and the particle shapes of the QDs 25 were substantially rectangular. Thus, the QDs 25** used in Example 1 have a better particle shape than the QDs for comparison used in Comparative Example 1, and have sufficiently higher QY than the comparative QDs for comparison. As a result, in Example 1, sufficiently higher EQE than in Comparative Example 1 was obtained.

Example 5

The QDs 25 were synthesized under the same conditions as in Synthesis Example 4. Thus, the QDs 25 were synthesized with a fluorescence full-width at half-maximum of 14 nm, a fluorescence wavelength of 443 nm, a particle size (diameter) of the QDs 25 of 12.8 nm and a shell thickness of 2.5 nm.

The particle size of the QDs 25 was calculated from the mean value of 500 samples in the observation of particles in the TEM image of the synthesized QDs 25.

The synthesized QDs 25 were washed three times to remove impurities such as synthesis raw materials and excess ligands. Thereafter, the QDs 25 were dispersed in hexane to obtain a QD dispersion according to this example.

The washing was carried out by adding an excessive amount of a polar solvent such as ethanol or methanol as a poor solvent to the reaction solution containing the synthesized QDs 25 to precipitate the QDs 25, followed by centrifugation to remove the supernatant containing the impurities. In this example, this washing operation was performed three times.

Subsequently, using the QD dispersion, a manufacturing operation similar to the manufacturing operation in Example 1 was performed to manufacture Samples 1 to 3 having following layered structures as the light-emitting element 1 according to the present embodiment.

Sample 1: ITO (30 nm)/PEDOT:PSS (40 nm)/PVK (20 nm)/QD layer (20 nm)/LiZnO (50 nm)/A1 (65 nm)

Sample 2: ITO (30 nm)/PEDOT:PSS (40 nm)/PVK (20 nm)/QD layer (20 nm)/ZnO (50 nm)/A1 (65 nm)

Sample 3: ITO (30 nm)/PEDOT:PSS (40 nm)/TFB (30 nm)/QD layer (20 nm)/LiZnO (50 nm)/A1 (65 nm)

Subsequently, respective EQE percentages of Samples 1 to 3 were measured using the same method as in Example 1. The results are shown in Table 2.

TABLE 2

| Sample | HTL material | HTL layer thickness | ETL material | ETL layer thickness | EQE (%) |
|---|---|---|---|---|---|
| (1) | PVK | 20 nm | LiZnO | 50 nm | 11.9 |
| (2) | PVK | 20 nm | ZnO | 50 nm | 8.0 |
| (3) | TFB | 30 nm | LiZnO | 50 nm | 6.2 |

As shown in Table 2, when the HTL 14 is PVK and the ETL 16 is LiZnO or ZnO, the EQE percentage is 7% or more, indicating that excellent light-emission characteristics can be obtained.

As described above, according to the present embodiment, it is possible to provide the light-emitting element 1 including Cd-free QDs 25 that emits blue light and has higher EQE than known devices.

Second Embodiment

Another embodiment of the disclosure will be described below. Note that, for convenience of description, members having the same functions as those of the members described in the above-described embodiment will be denoted by the same reference numerals and signs, and the description thereof will not be repeated.

Application in Display Device

As described above, the light-emitting element 1 is applied as, for example, the light source for the display device. As described above, in the present embodiment, the fluorescence wavelength of the QDs 25 and the fluorescence wavelength of the QD layer 15 can be adjusted within a range of, for example, 500 nm or more and 700 nm or less. Thus, the light-emitting element 1 is preferably applied as, for example, the blue light source of the display device. The light-emitting element 1 may be a light source that lights up by combining light sources of colors (a red light source, a green light source, and a blue light source) corresponding to pixels (an R pixel, a G pixel, and a B pixel), respectively. The display device utilizing this light source can express an image by a plurality of pixels each including the R pixel, the G pixel, and the B pixel.

Figure 14:
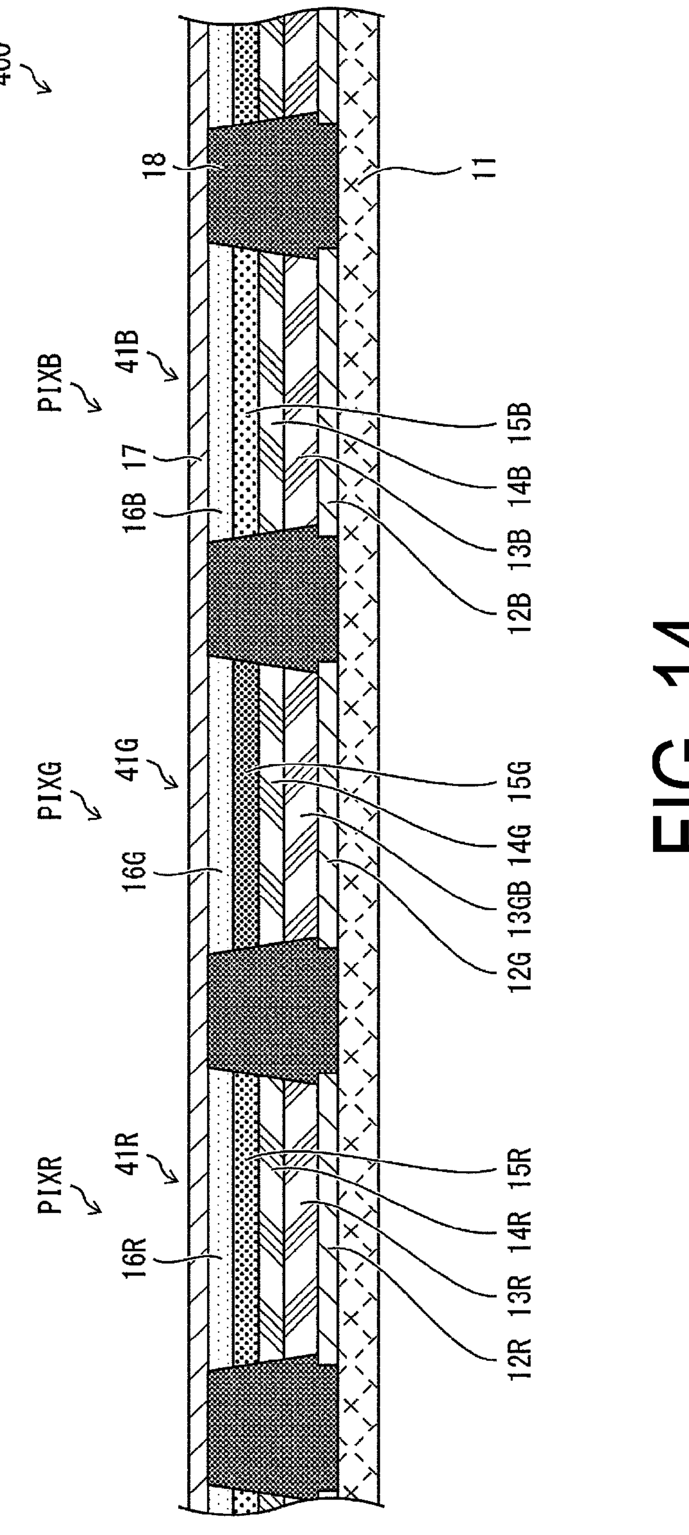
FIG. 14 is a cross-sectional view schematically illustrating an overall configuration of main portions of a display device according to a second embodiment.

FIG. 14 is a cross-sectional view schematically illustrating an overall configuration of main portions of a display device 400 (light-emitting device) according to the present embodiment.

Note that the present embodiment is described based on a case where the light-emitting device according to the present embodiment is the display device. However, as described above, the light-emitting device according to the present embodiment may be an illumination device such as the LED or the backlight device. The light-emitting device may be used as, for example, a display panel or the light source (illumination device) of the display device 400.

As illustrated in FIG. 14, the display device 400 (light-emitting device) according to the present embodiment includes a plurality of pixels each including the R pixel (PIXR), the G pixel (PIXG), and the B pixel (PIXB). Note that the R pixel may be referred to as an R subpixel. This similarly applies to the G pixel and the B pixel.

In the display device 400, one picture element is constituted by the PIXR, the PIXG, and the PIXB. Further, in the present embodiment, when there is no need to distinguish these pixels PIXR, PIXG, PIXB, the pixels PIXR, PIXG, PIXB are collectively referred to simply as PIX.

The display device 400 has a structure in which a light-emitting element layer including a plurality of kinds of light-emitting elements having different emission wavelengths is provided.

The light-emitting element layer is provided with light-emitting elements corresponding to each PIX. In the PIXR, a light-emitting element 41R is provided as the red light-emitting element. In the PIXG, a light-emitting element 41G is provided as the green light-emitting element. In the PIXB, a light-emitting element 41B is provided as the blue light-emitting element.

As illustrated in FIG. 14, the light-emitting element 41R includes an anode electrode 12R, an HIL 13R, an HTL 14R, a QD layer 15R, an ETL 16R, and the cathode electrode 17. The light-emitting element 41G includes an anode electrode 12G, an HIL 13G, an HTL 14G, a QD layer 15G, an ETL 16G, and the cathode electrode 17. The light-emitting element 41B includes an anode electrode 12B, an HIL 13B, an HTL 14B, a QD layer 15B, an ETL 16B, and the cathode electrode 17.

Each of the light-emitting elements 41R, 41G, and 41B has a configuration similar to that of the light-emitting element 1 illustrated in FIG. 1. Thus, each of the anode electrode 12R, the anode electrode 12G, and the anode electrode 12B has a configuration similar to that of the anode electrode 12 described in the first embodiment. Each of the HIL 13R, the HIL 13G, and the HIL 13B has a configuration similar to that of the HIL 13 described in the first embodiment. Each of the HTL 14R, the HTL 14G, and the HTL 14B has a configuration similar to that of the HTL 14 described in the first embodiment. Each of the ETL 16R, the ETL 16G, and the ETL 16B has a configuration similar to that of the ETL 16 described in the first embodiment.

Each of the QD layer 15R, the QD layer 15G, and the QD layer 15B has a configuration similar to that of the QD layer 15 described in the first embodiment. In the present embodiment, the Cd-free QDs 25 described in the first embodiment are used for the blue QDs used in the PIXB (light-emitting element 41B). However, the red QDs used in the PIXR (light-emitting element 41R) and the green QDs used in the PIXG (light-emitting element 41G) are not limited. Indium phosphide (InP), for example, can be suitably used as the red QDs and the green QDs when the materials are limited to non-Cd-based materials. When InP is used, the fluorescence full-width at half-maximum can be made relatively narrow, and high luminous efficiency can be obtained.

These PIXR, PIXG, and PIXB are formed by, for example, separately patterning layers corresponding to respective layers of the light-emitting element 1 including at least the QD layer 15 on the substrate 11 provided with a bank 18 using, for example, an ink-jet method.

Film formation of the ETL 16 may be implemented for each pixel unit or may be implemented in common for the plurality of pixels, provided that the display device 400 can light up the PIXR, PIXG, and PIXB individually.

The disclosure is not limited to the embodiments described above, and various modifications may be made within the scope of the claims. Embodiments obtained by appropriately combining technical approaches disclosed in the different embodiments also fall within the technical scope of the disclosure. Moreover, novel technical features may be formed by combining the technical approaches stated in each of the embodiments.

REFERENCE SIGNS LIST

1. 41B, 41G, 41R Light-emitting element (electroluminescent element)
12, 12B, 12G, 12R Anode electrode
13, 13B, 13G, 13R HIL (hole injection layer)
14, 14B, 14G, 14R HTL (hole transport layer)
15, 15B, 15G, 15R QD layer
16, 16B, 16G, 16R ETL (electron transport layer)
17 Cathode electrode
21 Ligand
25 QD (quantum dot)
25*a* Core
25*b* Shell
400 Display device (light-emitting device)

The invention claimed is:

1. An electroluminescent element comprising:

a first electrode;

a second electrode; and a quantum dot light-emitting layer containing a quantum dot and provided between the first electrode and the second electrode, wherein the quantum dot is a Cd-free quantum dot having a core-shell structure including a core and a shell and configured to emit blue light, the shell is formed by blending a shell material with an acidic compound and a zinc halide compound, the quantum dot contains a halogen element, and the shell is formed on a surface of the core in multiple steps by forming a film using a shell material blended with an acidic compound and not blended with a zinc halide compound, followed by forming a film using a shell material blended with both an acidic compound and a zinc halide compound.

2. The electroluminescent element according to claim 1, wherein the acidic compound is at least one selected from the group consisting of hydrogen chloride, hydrogen bromide, and trifluoroacetic acid.

3. The electroluminescent element according to claim 1, wherein the zinc halide compound is at least one of zinc chloride and zinc bromide.

4. The electroluminescent element according to claim 1, wherein the core contains Zn and Se, and the shell contains Zn and S.

5. The electroluminescent element according to claim 1, wherein a layer thickness of the shell is from 0.5 mm to 3 mm.

6. The electroluminescent element according to claim 1, comprising:

a hole transport layer provided between an anode electrode and the quantum dot light-emitting layer; and an electron transport layer is provided between a cathode electrode and the quantum dot light-emitting layer, wherein one of the first electrode and the second electrode is the anode electrode, and another is the cathode electrode, the hole transport layer contains poly(N-vinylcarbazole), and the electron transport layer contains at least one of ZnO and LiZnO.

7. A light-emitting device comprising:

at least one electroluminescent element according to claim 3.

8. The light-emitting device according to claim 7, wherein the light-emitting device is a display device.

9. A method for manufacturing an electroluminescent element including a first electrode, a second electrode, and a quantum dot light-emitting layer containing a quantum dot being Cd-free containing a halogen element, and provided between the first electrode and the second electrode, the method comprising:

forming the first electrode;

forming the quantum dot light-emitting layer containing the quantum dot;

forming the second electrode; and synthesizing the quantum dot prior to the forming the quantum dot light-emitting layer, wherein the synthesizing the quantum dot includes:

producing a core, and forming a shell on a surface of the core, and in the forming a shell;

a raw material for the shell is blended with an acidic compound and a zinc halide compound, and the shell is formed on the surface of the core in multiple steps by forming a film using a shell material blended with an acidic compound and not blended with a zinc halide compound, followed by forming a film using a shell material blended with both an acidic compound and a zinc halide compound.

10. The method according to claim 9, wherein in the producing a core, a core containing at least Zn and Se is produced as the core, and in the forming a shell, a shell containing Zn and S is formed on the surface of the core.

11. The method according to claim 9, wherein the acidic compound is at least one selected from hydrogen chloride, hydrogen bromide, and trifluoroacetic acid.

12. The method according to claim 9, wherein at least one of zinc chloride and zinc bromide is used as the zinc halide compound.

* * * * *